United States Patent
Fujimura et al.

(10) Patent No.: US 9,490,445 B2
(45) Date of Patent: *Nov. 8, 2016

(54) ORGANIC EL ELEMENT, ORGANIC EL PANEL, ORGANIC EL LIGHT-EMITTING APPARATUS, ORGANIC EL DISPLAY APPARATUS, AND METHOD OF MANUFACTURING ORGANIC EL ELEMENT

(71) Applicant: JOLED INC., Tokyo (JP)

(72) Inventors: Shinya Fujimura, Osaka (JP); Satoru Ohuchi, Osaka (JP); Takahiro Komatsu, Osaka (JP); Hirofumi Fujita, Osaka (JP); Yoshiaki Tsukamoto, Osaka (JP)

(73) Assignee: JOLED INC., Tokyo (JP)

( * ) Notice: Subject to any disclaimer, the term of this patent is extended or adjusted under 35 U.S.C. 154(b) by 138 days.

This patent is subject to a terminal disclaimer.

(21) Appl. No.: 13/736,419

(22) Filed: Jan. 8, 2013

(65) Prior Publication Data
US 2013/0126840 A1    May 23, 2013

Related U.S. Application Data

(63) Continuation of application No. PCT/JP2010/004833, filed on Jul. 30, 2010.

(51) Int. Cl.
*H01L 29/08* (2006.01)
*H01L 51/50* (2006.01)
(Continued)

(52) U.S. Cl.
CPC ......... *H01L 51/5088* (2013.01); *H05B 33/22* (2013.01); *H01L 51/56* (2013.01)

(58) Field of Classification Search
CPC ......... D06F 2058/2861; D06F 58/28; H01L 51/5088; H01L 51/56; H05B 33/22

USPC ..................... 257/40, 347; 445/24
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| CN | 1703122 | 11/2005 |
| CN | 101243553 | 8/2008 |

(Continued)

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

(Continued)

*Primary Examiner* — Mohammed Shamsuzzaman
(74) *Attorney, Agent, or Firm* — Greenblum & Bernstein, P.L.C.

(57) ABSTRACT

An organic EL element includes a hole injection layer that yields excellent hole conduction efficiency. The organic EL element includes an anode, a cathode, and functional layers that include organic material between the anode the cathode. The functional layers include a hole injection layer that injects holes into the functional layers. The hole injection layer is a metal oxide film that includes a metal oxide. The metal atoms constituting the metal oxide include both metal atoms at a maximum valence thereof and metal atoms at a valence less than the maximum valence, and the metal oxide film includes metal oxide crystals having a particle diameter on the order of nanometers.

22 Claims, 15 Drawing Sheets

(51) Int. Cl.
  *H05B 33/22* (2006.01)
  *H01L 51/56* (2006.01)

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 8,020,974 B2* | 9/2011 | Hara ............... B41J 2/161 347/70 |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0132265 A1* | 7/2004 | Maruyama ......... H01L 21/6835 438/458 |
| 2004/0178414 A1 | 9/2004 | Frey et al. |
| 2005/0064633 A1 | 3/2005 | Mikoshiba |
| 2005/0170208 A1 | 8/2005 | Yatsunami et al. |
| 2005/0208206 A1 | 9/2005 | Yoshikawa |
| 2005/0266763 A1* | 12/2005 | Kimura ............... H01L 51/0005 445/24 |
| 2006/0008931 A1 | 1/2006 | Lee et al. |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2007/0298160 A1* | 12/2007 | Jang ............... B82Y 30/00 427/58 |
| 2008/0083950 A1* | 4/2008 | Pan ............... B82Y 10/00 257/347 |
| 2008/0150422 A1 | 6/2008 | Ohara |
| 2008/0231179 A1 | 9/2008 | Abe et al. |
| 2009/0115318 A1 | 5/2009 | Gregory et al. |
| 2009/0160325 A1 | 6/2009 | Yatsunami et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0181554 A1 | 7/2010 | Yoshida et al. |
| 2010/0213827 A1 | 8/2010 | Yoshida et al. |
| 2010/0258833 A1 | 10/2010 | Okumoto et al. |
| 2010/0302221 A1 | 12/2010 | Okumoto |
| 2011/0037065 A1* | 2/2011 | Ueno ............... H01L 51/009 257/40 |
| 2011/0037068 A1 | 2/2011 | Yamazaki et al. |
| 2011/0042703 A1 | 2/2011 | Okumoto et al. |
| 2011/0140091 A1* | 6/2011 | Friend ............... H01L 51/422 257/40 |
| 2012/0061656 A1 | 3/2012 | Ohuchi et al. |
| 2012/0178191 A1 | 7/2012 | Sakanoue et al. |
| 2013/0126843 A1* | 5/2013 | Nishiyama ......... H01L 51/5088 257/40 |
| 2013/0126848 A1* | 5/2013 | Harada ............... H01L 51/5088 257/40 |
| 2013/0140542 A1* | 6/2013 | Harada ............... H01L 27/3246 257/40 |
| 2013/0313543 A1* | 11/2013 | Ohuchi ............... H01L 51/5088 257/40 |

FOREIGN PATENT DOCUMENTS

| | | |
|---|---|---|
| EP | 2175504 | 4/2010 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 2011-044445 | 3/2011 |
| TW | 200917894 | 4/2009 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2009/133903 | 11/2009 |
| WO | 2009/153328 | 12/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |

(56) References Cited

FOREIGN PATENT DOCUMENTS

| WO | 2012/017495 A1 | 2/2012 |
|---|---|---|
| WO | 2012/017502 A1 | 2/2012 |
| WO | 2012/017503 A1 | 2/2012 |

OTHER PUBLICATIONS

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/740,348 to Seiji Nishiyama et al., which was filed on Jan. 14, 2013.

U.S. Appl. No. 13/742,600 to Kenji Harada et al., which was filed on Jan. 16, 2013.

U.S. Appl. No. 13/742,584 to Kenji Harada et al., which was filed on Jan. 16, 2013.

U.S. Appl. No. 13/660,291 to Takahiro Komatsu et al., which was filed on Oct. 25, 2011.

International Search Report in PCT/JP2010/004833, dated Oct. 12, 2010.

International Search Report in PCT/JP2010/004985, dated Nov. 16, 2010.

International Search Report in PCT/JP2010/004992, dated Nov. 16, 2010.

International Search Report in PCT/JP2010/004991, dated Nov. 16, 2010.

International Search Report in PCT/JP2012/000963, dated May 15, 2012.

Meyer et al., "Charge generation layers comprising transition metal-oxide/organic interfaces: Electronic structure and charge generation mechanism", Applied Physics Letters, 96, 193302, pp. 1-3 (May 2010).

United States Office Action in U.S. Appl. No. 13/742,584, dated Apr. 14, 2014.

Ramana et al., "Electron microscopy investigation of structural transformation in tungsten oxide (WO3) thin films", Physica Status Solidi (a) 202, No. 10, pp. R108-R110 (Jul. 6, 2005).

Horsley et al., "Structure of Surface Tungsten Oxide Species in the WO3/AL2O3 Supported Oxide System from X-Ray Abortion Near-edge Spectroscopy and Raman Spectroscopy", Journal of Physical Chemistry, 91, pp. 4014-4020 (1987).

United States Office Action in U.S. Appl. No. 13/742,600, dated Apr. 14, 2014.

United States Office Action in U.S. Appl. No. 13/740,348, dated Apr. 29, 2014.

United States Office Action in U.S. Appl. No. 13/742,584, dated Aug. 7, 2014.

United States Office Action in U.S. Appl. No. 13/742,600, dated Aug. 18, 2014.

China Office Action from State Intellectual Property Office (SIPO) in Chinese Patent Application No. 201080068394.4, dated Dec. 31, 2014, together with a partial English language translation.

China Office Action from State Intellectual Property Office (SIPO) in Chinese Patent Application No. 201080068298.X, dated Jan. 12, 2015, together with a partial English language translation.

China Office Action from State Intellectual Property Office (SIPO) in Chinese Patent Application No. 201080068375.1, dated Jan. 26, 2015, together with a partial English language translation.

United States Notice of Allowance in U.S. Appl. No. 13/742,600, dated Jan. 12, 2015.

United States Notice of Allowance in U.S. Appl. No. 13/742,584, dated Jan. 29, 2015.

* cited by examiner

FIG. 13
Sample A
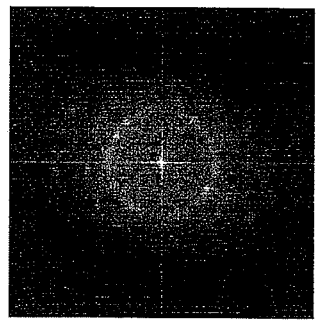 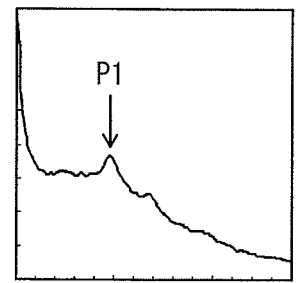
Sample B
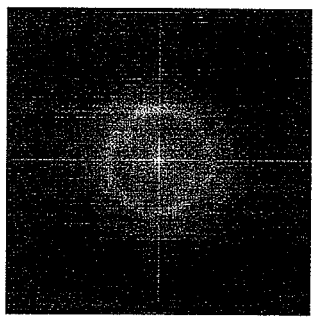 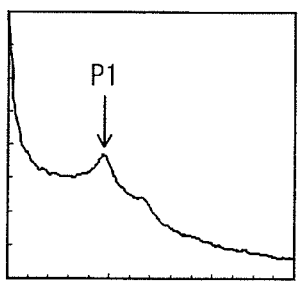
Sample C
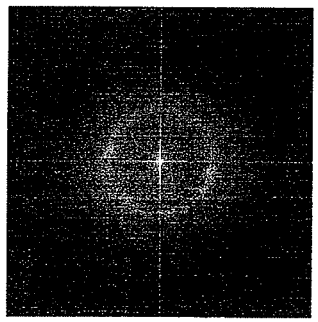 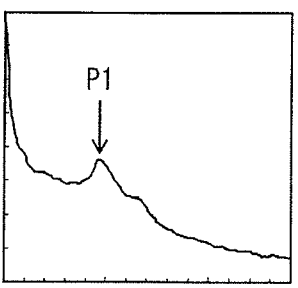

FIG. 14
Sample D
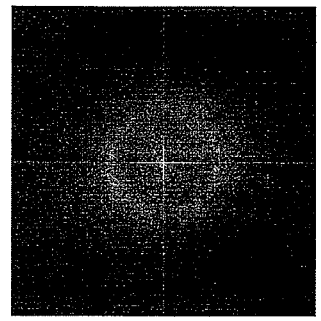 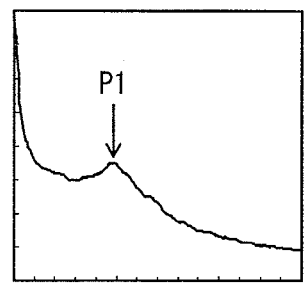
Sample E
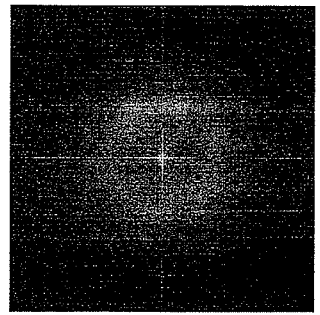 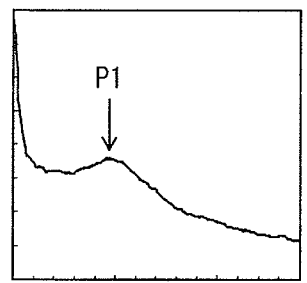

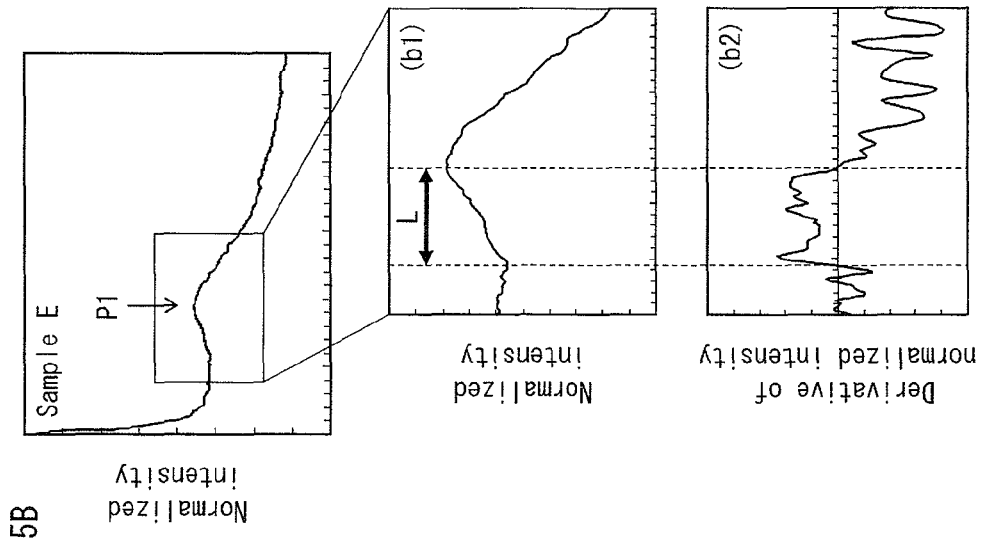
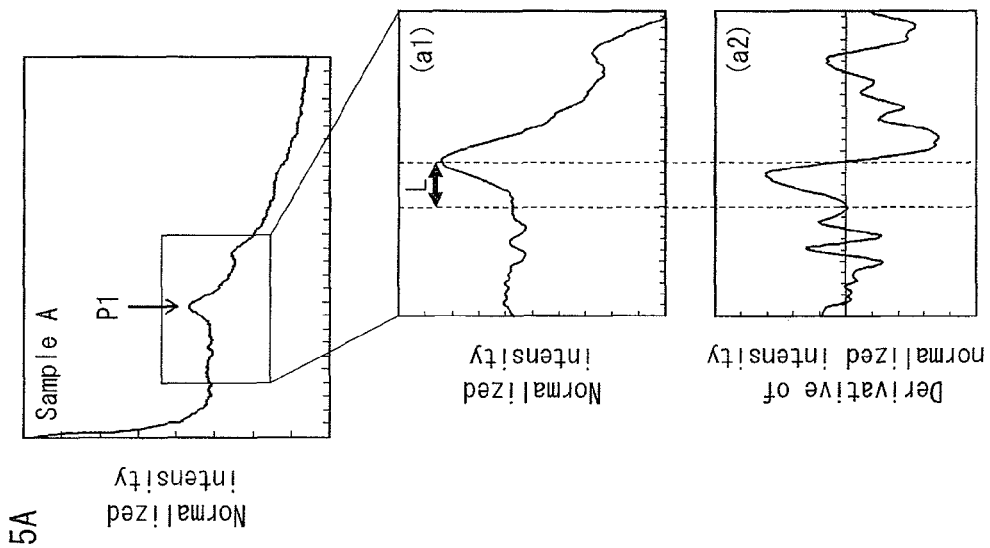
FIG. 15B
FIG. 15A

ORGANIC EL ELEMENT, ORGANIC EL PANEL, ORGANIC EL LIGHT-EMITTING APPARATUS, ORGANIC EL DISPLAY APPARATUS, AND METHOD OF MANUFACTURING ORGANIC EL ELEMENT

This is a continuation of International Application PCT/JP2010/004833, with an international filing date of Jul. 30, 2010.

TECHNICAL FIELD

The present invention relates to electric light-emitting elements that are organic electric-field light-emitting elements (hereinafter referred to as "organic EL elements") and in particular to technology for improving hole conduction efficiency in a hole injection layer.

BACKGROUND ART

In recent years, progress has been made in research and development of diverse functional elements that use organic semiconductors. Organic EL elements are among the most common of such functional elements. An organic EL element is a current-driven light emitter that includes a pair of electrodes, consisting of an anode and a cathode, and a functional layer disposed between the pair of electrodes. The functional layer includes a light-emitting layer formed from organic material. The emission of light from the organic EL element is caused by an electric-field light-emitting phenomenon taking place as a result of the recombination of holes injected from the anode to the functional layer and electrons injected from the cathode to the functional layer after application of voltage between the electrodes. Given the high visibility of organic EL elements resulting from their self-luminescence, as well as their excellent vibration resistance resulting from the solid-state structure thereof, more attention is now being given to the application of organic EL elements as a light emitter for various display devices or as a light source.

In order for an organic EL element to emit high intensity light, efficient injection of carriers (holes and electrons) from the electrodes to the functional layer is essential. Generally, provision of an injection layer in between each of the electrodes and the functional layer is effective in realizing efficient injection of carriers to the functional layer, since an injection layer has the function of lowering the energy barrier during injection. An organic material, such as copper phthalocyanine or PEDOT (conducting polymer), or a metal oxide, such as molybdenum oxide or tungsten oxide, is used as the hole injection layer provided between the functional layer and the anode. An organic material, such as a metal complex or oxadiazole, or a metal such as barium is used as the electron injection layer provided between the functional layer and the cathode.

Among such injection layers, an improvement in hole conduction efficiency as well as longevity of the organic EL element has been reported for an organic EL element using a metal oxide film composed of a metal oxide, such as molybdenum oxide or tungsten oxide, as the hole injection layer (see Patent Literature 1, 2, and Non-Patent Literature 1).

CITATION LIST

Patent Literature

Patent Literature 1: Japanese Patent Application Publication No. 2005-203339
Patent Literature 2: Japanese Patent Application Publication No. 2007-288074

Non-Patent Literature

Non-Patent Literature 1: Jingze Li et al., Synthetic Metals 151, 141 (2005).
Non-Patent Literature 2: M. Stolze et al., Thin Solid Films 409, 254 (2002).
Non-Patent Literature 3: Kaname Kanai et al., Organic Electronics 11, 188 (2010).
Non-Patent Literature 4: I. N. Yakovkin et al., Surface Science 601, 1481 (2007).

SUMMARY OF INVENTION

Technical Problem

Vapor deposition or sputtering is typically used as the method for forming the above metal oxide film. Taking into consideration the heat resistance of the layers already formed on the substrate at the point of formation of the metal oxide film, the metal oxide film is typically formed at a low substrate temperature of 200° C. or less.

Forming the metal oxide film at a low substrate temperature with the sputtering method easily leads to formation of a metal oxide film with a disorderly, amorphous structure, since thermal energy produced when the film formation gas reaches the substrate is quickly absorbed by the substrate. Furthermore, the difficulty of maintaining the composition and thickness of the metal oxide film uniform when forming the film at a low substrate temperature has also been reported (Non-Patent Literature 2).

When the metal oxide film is amorphous, the locations that contribute to conduction of holes injected into the metal oxide film, such as locations similar to an oxygen vacancy, are isolated from each other throughout the film. Conduction of holes in the film is therefore achieved primarily by hopping conduction. During hopping conduction, holes hop between the isolated hole conduction locations. In order to use such a metal oxide film when driving the organic EL elements, however, it is necessary to apply a high driving voltage to the organic EL elements, thereby causing the problem of a decrease in hole conduction efficiency.

The present invention has been conceived in view of the above problem and provides an organic EL element with a hole injection layer that yields excellent hole conduction efficiency.

Solution to Problem

In view of the above-presented problem, one aspect of the present invention is an organic EL element comprising an anode; a cathode; a functional layer, containing an organic material, between the anode and the cathode; and a hole injection layer, for injecting holes to the functional layer, between the anode and the functional layer, wherein the hole injection layer is a metal oxide film composed of a metal oxide, metal atoms constituting the metal oxide include both metal atoms at a maximum valence thereof and metal atoms at a valence less than the maximum valence, and the metal oxide film includes a crystal of the metal oxide, a particle diameter of the crystal being on an order of nanometers.

Advantageous Effects of Invention

In an organic EL element according to an aspect of the present invention, the hole injection layer is formed from a metal oxide film including a metal oxide, and metal atoms constituting the metal oxide include both metal atoms at a maximum valence thereof and metal atoms at a valence less than the maximum valence. Therefore, the metal oxide film is provided with structures similar to oxygen vacancies that act as regions for the conduction of holes. Furthermore, setting the particle diameter of the crystal to be on the order of nanometers allows for the formation, in the metal oxide film, of numerous crystal interfaces that include many structures similar to oxygen vacancies. As a result, conduction paths for holes extend through the metal oxide film in the direction of thickness thereof, allowing for effective hole conduction at a low driving voltage. It is thus possible to provide an organic EL element having a hole injection layer that yields excellent hole conduction efficiency.

BRIEF DESCRIPTION OF DRAWINGS

FIG. 13 shows Fourier transform images and plots of change in luminance for samples A, B, and C;

FIG. 14 shows Fourier transform images and plots of change in luminance for samples D and E;

FIGS. 15A and 15B are plots of change in luminance for samples A and E, with (a1) and (b1) being enlarged diagrams of each peak in normalized luminance closest to the center point in the plots of change in luminance, and (a2) and (b2) being the first derivative of the plots in (a1) and (b1)

DESCRIPTION OF EMBODIMENTS

Figure 1A:
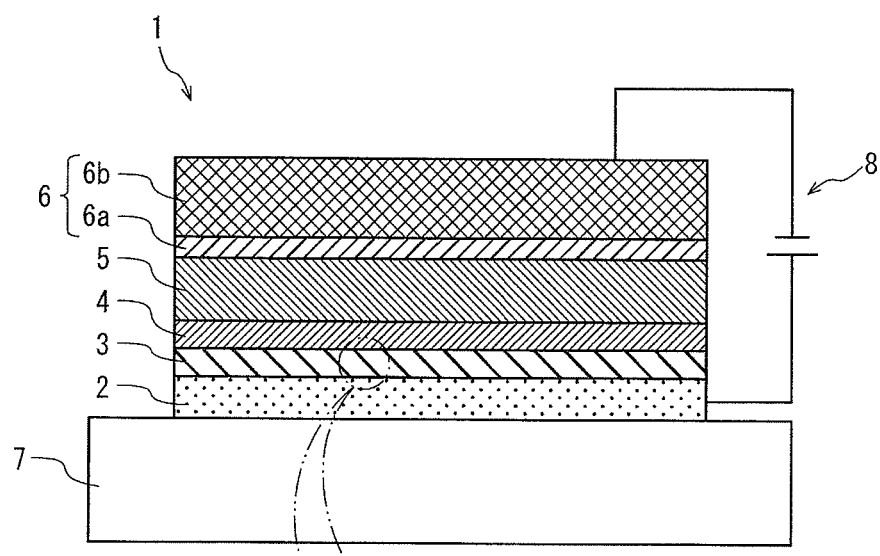
FIG. 1A is a schematic cross-sectional view illustrating the structure of an organic EL element 1 according to an embodiment.

Outline of an Aspect of the Present Invention

One aspect of the present invention is an organic EL element comprising an anode; a cathode; a functional layer, containing an organic material, between the anode and the cathode; and a hole injection layer, for injecting holes to the functional layer, between the anode and the functional layer, wherein the hole injection layer is a metal oxide film composed of a metal oxide, metal atoms constituting the metal oxide include both metal atoms at a maximum valence thereof and metal atoms at a valence less than the maximum valence, and the metal oxide film includes a crystal of the metal oxide, a particle diameter of the crystal being on an order of nanometers.

In the above aspect of the present invention, the hole injection layer includes crystals of a metal oxide, and metal atoms constituting the metal oxide include both metal atoms at a maximum valence thereof and metal atoms at a valence less than the maximum valence. Therefore, the hole injection layer is provided with structures similar to oxygen vacancies. Additionally, setting the particle diameter of the tungsten oxide crystal to be on the order of nanometers allows for the formation, in the tungsten oxide layer, of numerous crystal interfaces that include many structures similar to oxygen vacancies. In this context, the "particle diameter on an order of nanometers" refers to a size that is approximately 3 nm to 10 nm and that is smaller than the thickness of the hole injection layer.

The metal oxide may be tungsten oxide, the metal atoms at the maximum valence may be tungsten atoms with a valence of six, and the metal atoms at the valence less than the maximum valence may be tungsten atoms with a valence of five. A ratio $W^{5+}/W^{6+}$ of the number of the tungsten atoms with a valence of five to the number of the tungsten atoms with a valence of six may be at least 3.2%. Including tungsten atoms with a valence of five at a ratio of at least 3.2% with respect to tungsten atoms with a valence of six achieves even better hole conduction efficiency.

Setting the ratio $W^{5+}/W^{6+}$ to be at least 3.2% and at most 7.4% achieves even better hole conduction efficiency.

A hard X-ray photoelectron spectroscopy spectrum of a surface of the tungsten oxide film may exhibit a first peak and a second peak, the first peak corresponding to a $4f_{7/2}$ energy level of the tungsten atoms with a valence of six, and the second peak being in a region lower than the first peak in terms of binding energy. Specifically, the second peak may be in a region between 0.3 electron volts and 1.8 electron volts lower, in terms of binding energy, than the first peak. The first peak corresponds to the peak for tungsten atoms with a valence of six, whereas the second peak corresponds to the peak for tungsten atoms with a valence of five.

An area intensity of the second peak may be between 3.2% and 7.4% of an area intensity of the first peak. The ratio between the areas of the first peak in the second peak corresponds to the abundance ratio of tungsten atoms with a valence of five to tungsten atoms with a valence of six. The above range for the area intensity of the second peak therefore indicates that the ratio of the tungsten atoms with a valence of five to the tungsten atoms with a valence of six is between 3.2% and 7.4%.

Tungsten atoms at a valence less than the maximum valence may cause a band structure of the hole injection layer to have an occupied energy level in a range between 1.8 electron volts and 3.6 electron volts lower than a lowest energy level of a valence band in terms of binding energy.

Due to the existence of this occupied energy level, the hole injection barrier between the hole injection layer and the functional layer is reduced. This achieves even better hole injection efficiency. In this context, the "lowest energy level of a valence band in terms of binding energy" refers to the energy at a position at the upper end of the valence band from the vacuum level.

The tungsten oxide film may include a plurality of crystals of the tungsten oxide, each of the crystals having a particle diameter of between 3 nm and 10 nm, and regular linear structures at intervals of between 1.85 angstroms and 5.55 angstroms may appear in a lattice image by transmission electron microscopy observation of the tungsten oxide film. In a TEM photograph of a tungsten oxide film that includes crystals having a particle diameter of between 3 nm and 10 nm, regular linear structures appear based on how bright regions are partially aligned in the same direction. These regular linear structures suggest the existence of a crystal on the order of nanometers.

In a 2D Fourier transform image of the lattice image, a pattern of concentric circles centering on a center point of the 2D Fourier transform image may appear. The existence of a crystal on the order of nanometers results in the appearance of the above pattern of concentric circles.

In a plot of distance from the center point versus normalized luminance, the normalized luminance being a normalized value of the luminance of the 2D Fourier transform image at the corresponding distance, at least one peak of the normalized luminance may appear. One peak of the normalized luminance in the above plot corresponds to one of the concentric circles.

With a peak width being a difference between the distance corresponding to a position of a peak of the normalized luminance appearing closest to the center point in the plot and the distance corresponding to a position at which the peak of the normalized luminance begins to rise, the peak width may be less than 22 when a difference between the distance corresponding to the center point and the distance corresponding to the peak of the normalized luminance appearing closest to the center point is 100. The peak of the normalized luminance appearing closest to the center point corresponds to the concentric circle based on the existence of the crystal on the order of nanometers. As the number of crystals on the order of nanometers increases, the full width at half maximum of the peak of the normalized luminance decreases, i.e. the width of the normalized luminance decreases. Even better hole conduction efficiency can be achieved when the number of crystals on the order of nanometers is such that the peak width falls within a predetermined range.

The functional layer may include amine-containing material. In amine-containing organic molecules, the electron density of the HOMO is distributed centering on a lone pair of electrons of a nitrogen atom, which becomes a hole injection site. Including amine-containing material in the functional layer allows for formation of hole injection sites along the functional layer, thereby allowing holes that are conducted from the hole injection layer to be efficiently injected into the functional layer.

The functional layer may be one of a hole transfer layer that transfers holes, a light-emitting layer that emits light by recombination of electrons and holes injected thereto, and a buffer layer that one of adjusts optical characteristics and blocks electrons.

An organic EL panel, an organic EL light-emitting apparatus, and an organic EL display apparatus according to an aspect of the present invention are provided with the above organic EL element. This allows for an organic EL panel, an organic EL light-emitting apparatus, and an organic EL display apparatus that achieve the same advantageous effects as above.

A method of manufacturing an organic EL element according to an aspect of the present invention comprises the steps of: preparing an anode; forming a tungsten oxide film on the anode using a sputtering gas including argon gas and oxygen gas and using tungsten as a sputtering target, under film forming conditions such that a total pressure of the sputtering gas is at least 2.3 Pa and at most 7.0 Pa, a partial pressure of the oxygen gas in the sputtering gas is at least 50% and at most 70%, an input power density per unit area of the sputtering target is at least 1.5 W/cm$^2$ and at most 6.0 W/cm$^2$, and a value yielded by dividing the total pressure of the sputtering gas by the input power density is larger than 0.7 Pa·cm$^2$/W; forming a functional layer including organic material on the tungsten oxide film; and forming a cathode on the functional layer. The tungsten oxide film may be formed so that tungsten atoms constituting the tungsten oxide film include both tungsten atoms at a maximum valence thereof and tungsten atoms at a valence less than the maximum valence, and so as to include a tungsten oxide crystal having a particle diameter on an order of nanometers. When forming the tungsten oxide film, the value yielded by dividing the total pressure of the sputtering gas by the input power density may be less than 3.2 Pa·cm$^2$/W. Performing the above steps allows for formation of an organic EL element that achieves the same advantageous effects as above.

Embodiments

Structure of Organic EL Element

Figure 1B:
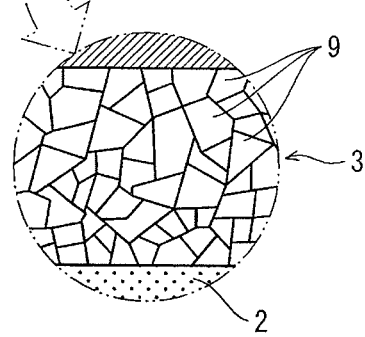
FIG. 1B is a partially expanded view centered on a hole injection layer 3.

FIG. 1A is a schematic cross-sectional view illustrating the structure of an organic EL element 1 according to the present embodiment, and FIG. 1B is a partially expanded view centered on a hole injection layer 3.

The organic EL element 1 is, for example, manufactured by applying a functional layer with a wet process. The hole injection layer 3 and a variety of functional layers that have predetermined functions and include organic material are layered together and placed between a pair of electrodes consisting of an anode 2 and a cathode 6.

Specifically, as shown in FIG. 1A, the organic EL element 1 includes the following layered on the main side of a substrate 7 in this order: the anode 2, the hole injection layer 3, a buffer layer 4 (an example of a functional layer), a light-emitting layer 5 (an example of a functional layer), and the cathode 6 (composed of a barium layer 6a and an aluminum layer 6b).

Substrate 7, Anode 2

The substrate 7 is the base material for the organic EL element 1 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

While not shown in the figures, a TFT (thin film transistor) is provided on the surface of the substrate 7 for driving the organic EL element 1, with the anode 2 layered thereabove. The anode 2 is, for example, formed from a thin ITO film having a thickness of 50 nm.

Hole Injection Layer 3

The hole injection layer 3 is formed from a tungsten oxide film (WOx) having a thickness of, for example, 30 nm. In the composition formula WOx denoting the composition of the tungsten oxide, x is a real number existing within a range of approximately 2<x<3. While it is desirable for the hole injection layer 3 to be formed only from tungsten oxide, the inclusion of a trace level of impurities is acceptable, provided that the amount does not exceed the amount of impurities that might normally be incorporated.

The tungsten oxide film is formed under predetermined film forming conditions. Details on these predetermined film forming conditions are provided in the sections "Outline of Method of Manufacturing Organic EL Element 1" and "Film Forming Conditions for Hole Injection Layer 3". By forming the tungsten oxide film under these predetermined film forming conditions, the tungsten oxide film includes an abundance of tungsten oxide crystals 9 as illustrated in FIG. 1B. The crystals 9 are formed so that the particle diameter of each crystal 9 is on the order of nanometers. For example, if the thickness of the hole injection layer 3 is approximately 30 nm, the particle diameter of the crystals 9 is approximately between 3 nm and 10 nm. Hereinafter, the crystals 9 whose particle diameter is on the order of nanometers are referred to as "nanocrystals 9", and a layered structure composed of nanocrystals 9 is referred to as a "nanocrystal structure". Note that in the hole injection layer 3, regions other than the regions with the nanocrystal structure include an amorphous structure.

In a hole injection layer 3 with the above nanocrystal structure, the tungsten atoms (W) constituting the tungsten oxide are distributed to include both atoms at the maximum valence possible for tungsten and atoms at a valence less than the maximum valence. Typically, the crystal structure of tungsten oxide is not uniform, but rather includes structures similar to an oxygen vacancy. Within tungsten oxide having a crystal structure that does not include a structure similar to an oxygen vacancy, the maximum valence possible for tungsten is a valence of six. On the other hand, within tungsten oxide having a crystal structure that does include a structure similar to an oxygen vacancy, it is known that the valence of tungsten is a valence of five, which is lower than the maximum valence. The tungsten oxide film includes tungsten atoms at a variety of valences, including both the maximum valence and a valence lower than the maximum valence. The overall valence for the film is the average of these different valences.

It has been reported that forming a structure similar to an oxygen vacancy improves the hole conduction efficiency due to an electron level that is based on the structure (Non-Patent Literature 3). Furthermore, it is known that this structure similar to an oxygen vacancy is abundant along the crystal surface, as described with reference to FIG. 9.

Therefore, distributing tungsten atoms with a valence of five and tungsten atoms with a valence of six in the tungsten oxide and providing the hole injection layer 3 with structures similar to an oxygen vacancy offers the promise of increased hole conduction efficiency. Specifically, the holes provided from the anode 2 to the hole injection layer 3 are conducted along oxygen vacancies existing along the crystal interface. Therefore, providing the tungsten oxide film with the nanocrystal structure allows for an increase in the number of paths by which holes are conducted, thus leading to an improvement in hole conduction efficiency. In turn, this allows for a decrease in the driving voltage of the organic EL element 1.

Additionally, the tungsten oxide forming the hole injection layer 3 has high chemical resistance, i.e. the tungsten oxide does not easily undergo undesired chemical reactions. Therefore, even if the hole injection layer 3 comes into contact with solvents or the like used during processes performed after formation of the hole injection layer 3, damage to the hole injection layer 3 due to dissolution, degradation, or a change of properties is reduced. Forming the hole injection layer 3 from a material with high chemical resistance thus prevents a reduction in hole conduction properties of the hole injection layer 3.

The hole injection layer 3 in the present embodiment includes both the case of being formed only from tungsten oxide with a nanocrystal structure and the case of being formed from tungsten oxide with a nanocrystal structure and tungsten oxide with an amorphous structure. Furthermore, it is desirable that the nanocrystal structure be present throughout the hole injection layer 3. Holes can be efficiently conducted from the lower edge of the hole injection layer 3 to the upper edge of the hole injection layer 3, however, as long as grain boundaries are connected in at least one location between the interface where the anode 2 contacts with the hole injection layer 3 and the interface where the hole injection layer 3 contacts with the buffer layer 4.

Note that examples have been reported on in the past of using a tungsten oxide film including crystallized tungsten oxide as the hole injection layer. For example, Non-Patent Literature 1 reports that crystallizing a tungsten oxide film by annealing at 450° C. improves hole conduction properties. However, Non-Patent Literature 1 does not demonstrate the potential for practical mass-production of a large organic EL panel nor describe the effect on other layers above the substrate due to formation of the hole injection layer. Furthermore, Non-Patent Literature 1 does not disclose purposely forming tungsten oxide nanocrystals having an oxygen vacancy in the hole injection layer. The hole injection layer according to an aspect of the present invention is formed from a tungsten oxide film that is resistant to chemical reactions, is stable, and can withstand the mass production process of large organic EL panels. Furthermore, purposely incorporating oxygen vacancies in the tungsten oxide film achieves excellent hole conduction properties and hole injection efficiency, another decisive difference from conventional technology.

Functional Layer

Other than the hole injection layer 3, the organic EL element 1 includes a functional layer that fulfills certain functions necessary for the organic EL element 1. The functional layer of the present invention is either one, a combination of two or more, or every one of layers such as the following: a hole transport layer, a light-emitting layer, and a buffer layer. The hole transport layer transports holes. The light-emitting layer emits light as a result of recombination of holes and electrons which are injected therein. The buffer layer is used for the adjustment of optical characteristics or for blocking electrons. In the present embodiment, an example is described in which the functional layer includes the buffer layer 4 and the light-emitting layer 5.

The buffer layer 4 is, for example, a 20 nm-thick layer of TFB (poly(9,9-di-n-octylfluorene-alt-(1,4-phenylene-((4-sec-butylphenyl)imino)-1, 4-phenylene)), which is an amine-containing organic polymer.

Forming the buffer layer 4 from an amine-containing organic molecules allows for holes conducted from the hole injection layer 3 to be efficiently injected into the functional layer formed above the buffer layer 4. This is because in amine-containing organic molecules, the electron density of the HOMO is distributed centering on a lone pair of electrons of a nitrogen atom, which becomes a hole injection site. Including amine-containing organic molecules in the buffer layer 4 allows for formation of hole injection sites by the buffer layer 4.

The light-emitting layer 5 is, for example, a 70 nm-thick layer of F8BT (poly(9,9-di-n-octylfluorene-alt-benzothiadiazole)), which is an organic polymer. However, the material to be used in forming the light-emitting layer 5 is not limited to this, and the light-emitting layer 5 may include a commonly-known organic material. For example, the light-emitting layer 5 may be formed from a fluorescent material such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group III metal, metal complex of oxine, rare earth metal complex, etc., as recited in Japanese Patent Application Publication No. H5-163488.

Cathode 6

The cathode 6 is, for example, composed of a barium layer 6a with a thickness of 5 nm on which is layered an aluminum layer 6b with a thickness of 100 nm. A direct current power supply 8 is connected to the above-described anode 2 and cathode 6 so as to supply power from an external source to the organic EL element 1.

Outline of Method of Manufacturing Organic EL Element 1

The following outlines a method of manufacturing the organic EL element 1 based on FIGS. 1A and 1B.

First, the substrate 7 is placed inside the chamber of a sputtering film-forming apparatus. A predetermined sputtering gas is injected into the chamber, and using the reactive sputtering method, the anode 2 is formed from ITO to a thickness of 50 nm.

Next, the hole injection layer 3 is formed. It is desirable that the hole injection layer 3 be formed with the reactive sputtering method. Specifically, metal tungsten is placed in the chamber as the sputtering target, with argon gas as the sputtering gas and oxygen gas as the reactive gas. Under these conditions, the argon is ionized by the application of high voltage and caused to bombard the sputtering target. The metal tungsten ejected as a result of the sputtering phenomenon reacts with the oxygen gas to produce tungsten oxide, thus forming the tungsten oxide film on the anode 2.

While details on the film forming conditions are provided in the following section, in brief, the following conditions are desirable: (1) the total pressure of the sputtering gas composed of argon gas and oxygen gas should be at least 2.3 Pa and at most 7.0 Pa, and (2) the partial pressure of the oxygen gas with respect to the total pressure of the sputtering gas should be at least 50% and at most 70%. Furthermore, (3) the input power per unit area of the target (input power density) should be at least 1.5 W/cm$^2$ and at most 6.0 W/cm$^2$, and (4) the value yielded by dividing the total pressure of the sputtering gas by the input power density should be larger than 0.7 Pa·cm$^2$/W. The tungsten oxide film having a nanocrystal structure is formed under these film forming conditions.

As described above, the tungsten oxide forming the hole injection layer 3 has high chemical resistance. Therefore, even if the hole injection layer 3 comes into contact with solvents or the like used during subsequent processes, damage to the hole injection layer 3 due to dissolution, degradation, or a change of properties is reduced.

Next, drops of ink composition containing organic amine-containing molecular material are dripped onto the surface of the hole injection layer 3 by a wet process, such as spin coating or an inkjet method, and the solvent is removed by volatilization. The buffer layer 4 is thus formed.

Next, drops of ink composition containing organic light-emitting material are dripped by the same method onto the surface of the buffer layer 4, and the solvent is removed by volatilization. The light-emitting layer 5 is thus formed.

Here, it should be noted that the method for forming the buffer layer 4 and the light-emitting layer 5 is not limited to the above method. Other than spin coating and the inkjet method, ink may be ejected/applied by another commonly-known method such as the gravure printing method, the dispenser method, the nozzle coating method, the intaglio printing method, or the relief printing method.

Next, the barium layer 6a and the aluminum layer 6b are formed on the surface of the light-emitting layer 5 by vacuum deposition. The cathode 6 is thus formed.

Note that while not illustrated in FIG. 1A, a sealing layer may be additionally provided on the surface of the cathode 6, or a sealing cap may be provided to isolate the entire organic EL element 1 from external space, in order as to prevent the organic EL element 1 from being exposed to the atmosphere after completion. The sealing layer may be formed, for example, by using materials such as SiN (silicon nitride) and SiON (silicon oxynitride), and may be disposed such that the organic EL element 1 is sealed therein. When using a sealing cap, the sealing cap may be formed by using, for instance, the same material as the substrate 7, and a getter which absorbs moisture and the like may be provided within the sealed space.

Performance of the above steps completes the organic EL element 1.

Experiments on Film Forming Conditions for Hole Injection Layer 3 and Analysis of Results Film Forming Conditions for Hole Injection Layer 3

In the present embodiment, the tungsten oxide constituting the hole injection layer 3 is formed under predetermined film forming conditions, thus intentionally providing the hole injection layer 3 with a nanocrystal structure to improve hole conduction properties and allows for a low driving voltage for the organic EL element 1. These predetermined film forming conditions are now described in detail.

A DC magnetron sputtering device was used as the sputtering device, with metal tungsten as the sputtering target. The substrate temperature was not controlled. It is considered desirable to form the film using the reactive sputtering method, with argon gas as the sputtering gas, oxygen gas as the reactive gas, and an equivalent amount of each gas released. Note that the method of forming the hole injection layer 3 is not limited to these conditions. Well-known methods other than sputtering may be used for film formation, such as the vapor deposition method or CVD.

In order to form a tungsten oxide film with high crystallinity, it is necessary for atoms to form a regular film on the substrate, and it is desirable to form the film at as low a deposition rate as possible. The film forming rate during film formation by sputtering is considered to depend on the above conditions (1) through (4). As a result of the experiments described below, it was confirmed that with the above numerical ranges for conditions (1) through (4), the driving voltage lowers, and a tungsten oxide film with high crystallinity is obtained.

With respect to condition (1), note that while the upper limit of the total pressure in the experiment conditions described below is 4.7 Pa, it was confirmed separately that a similar trend is exhibited at least up to 7.0 Pa.

Furthermore, with respect to condition (2), while the partial pressure of the oxygen gas with respect to the total pressure is set to 50%, the reduction in driving voltage was confirmed at least in the range between 50% and 70%.

A further explanation of condition (4) is now provided. When the amounts of argon gas and oxygen gas that are released are equivalent, it is assumed that film properties are determined by the input power density and the pressure at the time of film formation (total pressure). The input power density in condition (3) changes both the number and energy of sputtered tungsten atoms and tungsten atom clusters. In other words, by reducing the input power density, the number of sputtered tungsten atoms decreases, so that the tungsten film formed on the substrate can be formed at a low energy, thus offering the promise of film formation at a low film formation rate. The total pressure at the time of film formation in condition (1) changes the mean free path to the film formation substrate of the tungsten atoms and tungsten atom clusters that are sputtered and released in the gas phase. In other words, when the total pressure is high, the probability that the tungsten atoms and tungsten atom clusters will repeatedly collide with gas components in the film formation chamber before reaching the substrate increases. It is considered that an increase in the randomness of the flying tungsten atoms and tungsten atom clusters reduces the number of tungsten atoms that form as a film on the substrate and causes the tungsten to form the film at a low energy. As a result, film formation at a low film formation rate can be expected.

It is considered, however, that there are limits to the extent to which device characteristics can be improved by independently controlling the input power density and the total pressure at the time of film formation in order to change the film forming rate during sputtering. Accordingly, the value yielded by dividing the total pressure at the time of film formation (Pa) by the input power density (W/cm$^2$) was established as a new film forming condition (4) serving as an index to determine the film forming rate of the tungsten atoms.

Through experiment, the following tendencies were confirmed: as the value of the film forming condition (4) increases, the driving voltage decreases, and the film forming rate decreases; conversely, as the value of the film forming condition (4) decreases, the driving voltage increases, and the film forming rate increases.

Specifically, in the experiment conditions described below, the total pressure/power density was at least 0.78 Pa·cm$^2$/W. A value larger than 0.7 Pa·cm$^2$/W is considered desirable, and for even more reliable film formation, a value of 0.8 Pa·cm$^2$/W or greater is considered desirable. On the other hand, the upper limit on the total pressure/power density was 3.13 Pa·cm$^2$/W in the experiment conditions. A value less than 3.2 Pa·cm$^2$/W is considered desirable, and for even more reliable film formation, a value of 3.1 Pa·cm$^2$/W or less is considered desirable. As described above, however, out of consideration for the film formation rate, restrictions are not necessarily placed on the upper limit.

Next, the inventors confirmed the validity of the above film forming conditions through experiments.

Figure 2:
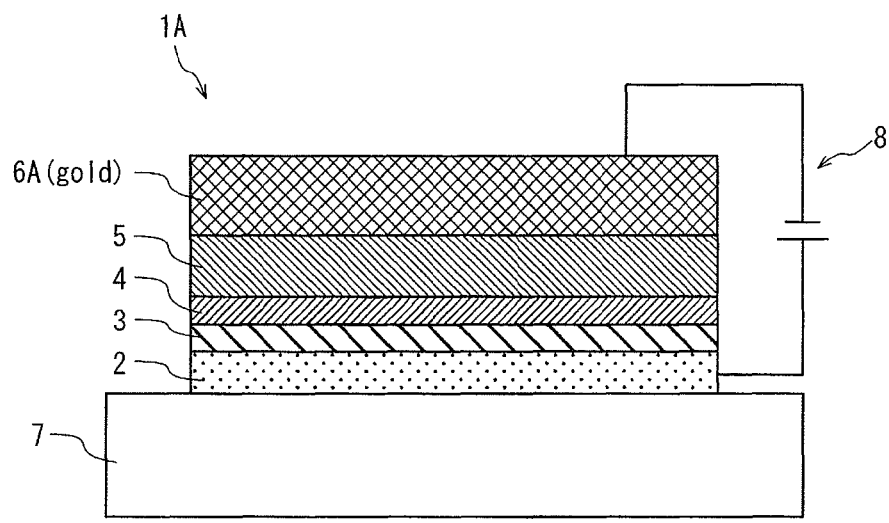
FIG. 2 is a schematic cross-section diagram illustrating a structure of a hole-only device 1A.

First, hole-only devices 1A as illustrated in FIG. 2 were manufactured as assessment devices in order to assess the degree to which the hole conduction efficiency from the hole injection layer 3 to the buffer layer 4 depends on film forming conditions.

In an actual operating organic EL element, the carriers constituting electric current consist of both holes and electrons. As such, the electrical characteristics of an organic EL element reflect not only hole current, but also electron current. In a hole-only device, however, the injection of electrons from the cathode is blocked, and there is almost no flow of electron current. Therefore, the current consists almost entirely of hole current. The carriers can thus be considered almost entirely to be holes, making the hole-only device appropriate for assessment of hole conduction efficiency.

As illustrated in FIG. 2, the hole-only device 1A is the organic EL element 1 in FIG. 1A, with the cathode 6 replaced by a cathode 6A made from gold. Specifically, the hole-only device 1A was composed of the following layered on a substrate 7 in this order: an anode 2 composed of a thin ITO film with a thickness of 50 nm, a hole injection layer 3 composed of tungsten oxide and having a thickness of 30 nm, a buffer layer 4 composed of TFB and having a thickness of 20 nm, a light-emitting layer 5 composed of F8BT and having a thickness of 70 nm, and a cathode 6A composed of gold and having a thickness of 100 nm.

In the manufacturing of the hole-only device 1A, the hole injection layer 3 was formed by applying the reactive sputtering method with a DC magnetron sputtering device. The gas introduced into the chamber was composed of at least one of argon gas and oxygen gas, and the sputtering target used was metal tungsten. The substrate temperature was not controlled, whereas the total pressure was adjusted by varying the flow amount of each gas. As shown in Table 1, the hole-only device 1A was manufactured under each of five film forming conditions, A through E. The total pressure and the input power density differed between the film forming conditions, as can be seen in Table 1. The partial pressure of the argon gas and the oxygen gas in the chamber were each 50%.

Hereinafter, the hole-only device 1A formed under film forming conditions A is referred to as HOD-A, the hole-only device 1A formed under film forming conditions B is referred to as HOD-B, the hole-only device 1A formed under film forming conditions C is referred to as HOD-C, the hole-only device 1A formed under film forming conditions D is referred to as HOD-D, and the hole-only device 1A formed under film forming conditions E is referred to as HOD-E.

TABLE 1

| Film Forming Conditions | Total Pressure (Pa) | Oxygen Partial Pressure (%) | Input Power Density (W/cm$^2$) | Total Pressure/ Power Density (Pa · cm$^2$/W) |
|---|---|---|---|---|
| A | 4.70 | 50 | 1.50 | 3.13 |
| B | 4.70 | 50 | 3.00 | 1.57 |
| C | 4.70 | 50 | 6.00 | 0.78 |
| D | 2.35 | 50 | 1.50 | 1.57 |
| E | 2.35 | 50 | 6.00 | 0.39 |

The completed hole-only devices were then connected to a direct current power supply 8 and voltage was applied thereto. Furthermore, by changing the applied voltage, an electric current value per unit surface area (current density) was calculated for different voltages.

Figure 3:
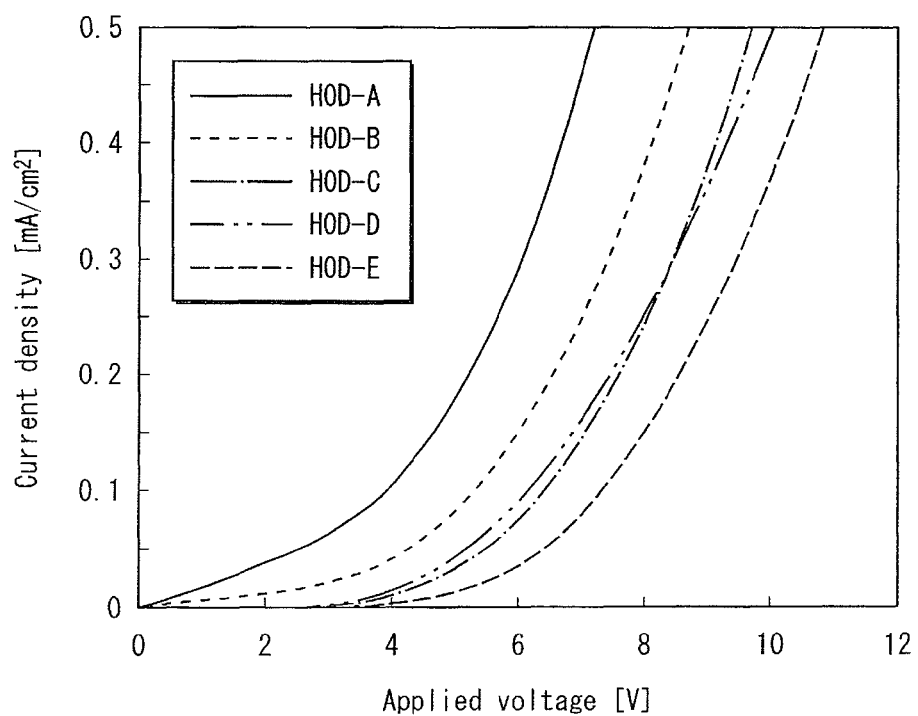
FIG. 3 is a device characteristics diagram showing relation curves illustrating relations between applied voltage and current density of the hole-only devices.

FIG. 3 is a device characteristics diagram showing relation curves illustrating relations between applied voltage and current density of the hole-only devices. In FIG. 3, the vertical axis indicates current density (mA/cm$^2$), whereas the horizontal axis indicates applied voltage (V).

Table 2 shows the driving voltage for each sample HOD-A through HOD-E yielded by the corresponding experiment. Note that the expression "driving voltage" in Table 2 is the voltage applied when the current density value is a specific, practical value of 0.3 mA/cm$^2$.

TABLE 2

| Name of Sample | Driving Voltage (V) |
| --- | --- |
| HOD-A | 6.25 |
| HOD-B | 7.50 |
| HOD-C | 8.50 |
| HOD-D | 8.50 |
| HOD-E | 9.49 |

It can said that as the driving voltage grows smaller, the hole conduction efficiency of the hole injection layer 3 is higher. This is because the components of each hole-only device other than the hole injection layer 3 are prepared according to the same manufacturing method. Therefore, other than the hole injection layer 3, the hole injection barrier between two adjacent layers can be assumed to be constant. Furthermore, it was confirmed through another experiment that the anode 2 and the hole injection layer 3 in this experiment are in ohmic contact. Accordingly, the differences in driving voltage depending on the film forming conditions for the hole injection layer 3 can be considered to strongly reflect the hole conduction efficiency from the hole injection layer 3 to the buffer layer 4.

As illustrated in Table 2 and FIG. 3, it is clear that as compared to HOD-E, which is manufactured under the film forming conditions with a low total pressure and the maximum input power density, HOD-A through HOD-D have superior hole conduction efficiency.

Thus far, tests on the hole conduction efficiency of the hole injection layer 3 in the hole-only devices 1A have been described. Except for the cathode 6A, the hole-only device 1A has the same structure as the organic EL element 1, which actually operates (FIGS. 1A and 1B). Accordingly, in the organic EL element 1 as well, the dependence of the hole conduction efficiency from the hole injection layer 3 to the buffer layer 4 on film forming conditions is essentially the same as the hole-only device 1A. In order to confirm this point, organic EL elements 1 were prepared using a hole injection layer 3 formed under film forming conditions A through E. Hereinafter, the organic EL element 1 formed under film forming conditions A is referred to as BPD-A, the organic EL element 1 formed under film forming conditions B is referred to as BPD-B, the organic EL element 1 formed under film forming conditions C is referred to as BPD-C, the organic EL element 1 formed under film forming conditions D is referred to as BPD-D, and the organic EL element 1 formed under film forming conditions E is referred to as BPD-E.

As illustrated in FIG. 1A, each of the organic EL elements was composed of the following layered on a substrate 7 in this order: an anode 2 composed of a thin ITO film with a thickness of 50 nm; a hole injection layer 3 layered on the anode 2, composed of tungsten oxide and having a thickness of 30 nm; a buffer layer 4 composed of TFB and having a thickness of 20 nm; a light-emitting layer 5 composed of F8BT and having a thickness of 70 nm; and a cathode 6 composed of a 5-nm layer of barium and a 100-nm layer of aluminum. The organic EL elements 1 prepared under film forming conditions A through E were then connected to a direct current power supply 8 and voltage was applied thereto. Furthermore, by changing the applied voltage, an electric current value per unit surface area (current density) was calculated for different voltages.

Figure 4:
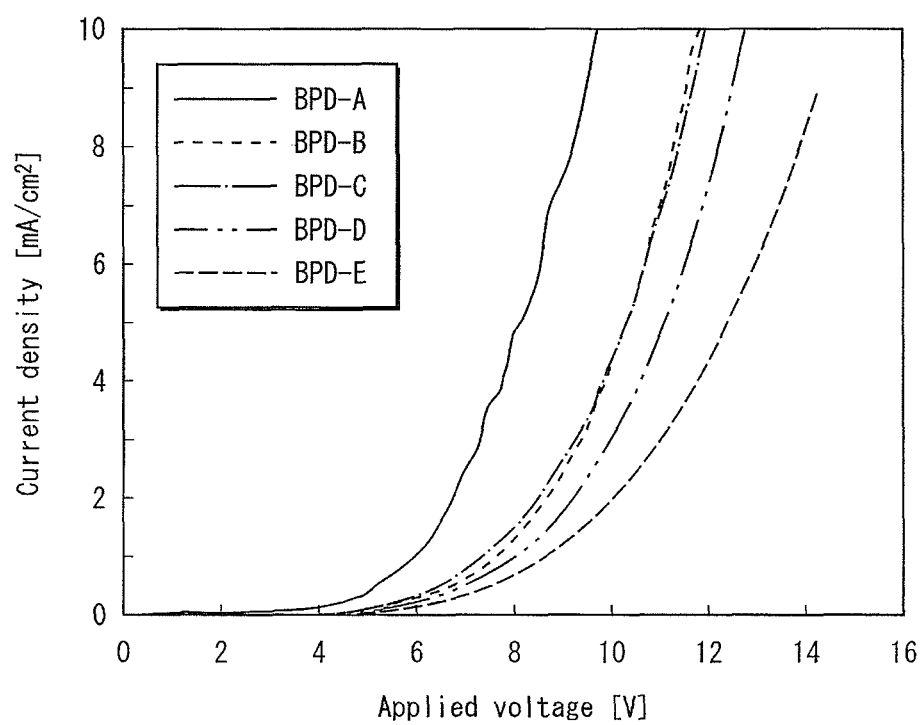
FIG. 4 is a device characteristics diagram showing relation curves illustrating relations between applied voltage and current density of organic EL elements.

FIG. 4 is a device characteristics diagram showing relation curves illustrating relations between applied voltage and current density of organic EL elements. In FIG. 4, the vertical axis indicates current density (mA/cm$^2$), whereas the horizontal axis indicates applied voltage (V). Table 3 shows the driving voltage for each sample BOD-A through BOD-E yielded by the corresponding experiment. Note that the expression "driving voltage" in Table 3 is the voltage applied when the current density value is a specific, practical value of 8 mA/cm$^2$.

TABLE 3

| Name of Sample | Driving Voltage (V) |
| --- | --- |
| BPD-A | 9.25 |
| BPD-B | 11.25 |
| BPD-C | 11.50 |
| BPD-D | 12.25 |
| BPD-E | 14.00 |

As illustrated in Table 3 and FIG. 4, compared to the other organic EL elements, the current density-applied voltage curve rises the slowest for BPD-E, which requires the highest applied voltage in order to achieve a high current density. This trend is similar to the trend observed in the hole-only devices HOD-A through HOD-E, which were prepared under the same respective film forming conditions.

From the above results, it was confirmed that in the organic EL elements 1 as well, the hole conduction efficiency of the hole injection layer 3 depends on the film forming conditions, similar to the case of the hole-only devices 1A. Specifically, it was confirmed that forming the film under the conditions provided by the ranges in film forming conditions A, B, C, and D increases the hole conduction efficiency from the hole injection layer 3 to the buffer layer 4, thereby achieving a low driving voltage.

Note that among the above conditions, the condition concerning input power is represented in terms of input power density, as indicated in Table 1. When using a DC magnetron sputtering device that is different from the DC magnetron sputtering device used in the present experiment, a hole injection layer 3 composed of a tungsten oxide film with excellent hole conduction efficiency, as in the present experiment, can be yielded by adjusting the input power according to the size of the magnet at the back surface of the sputtering target so that the input power density fulfills the above condition. Conditions on total pressure and oxygen partial pressure, on the other hand, are independent of the device, the size of the target, and the magnet size of the target.

Additionally, the sputtering device was placed under room temperature during the experiment, and the substrate temperature was not intentionally adjusted while forming the hole injection layer 3 through the reactive sputtering method. Therefore, the substrate was at room temperature at least before the forming of the hole injection layer 3. However, while the hole injection layer 3 was being formed, there is a possibility that the substrate temperature may have risen by several tens of degrees Celsius.

Note that through a separate experiment, the inventors confirmed that when the oxygen partial pressure is raised too high, the driving voltage conversely ends up rising. Accordingly, it is desirable for the oxygen partial pressure to be between 50% and 70%.

The above experiment results indicate that for a low driving voltage, an organic EL element provided with a hole injection layer manufactured under film forming conditions A, B, C, and D is desirable, and that an organic EL element manufactured under film forming conditions A and B is even more desirable. Hereinafter, an organic EL element provided with a hole injection layer manufactured under film forming conditions A, B, C, or D is the target of the present disclosure.

Chemical State of Tungsten in the Hole Injection Layer 3

The above-described nanocrystal structure exists in the tungsten oxide constituting the hole injection layer 3 in the organic EL element 1 of the present embodiment. This nanocrystal structure is formed by adjusting the film forming conditions described in the experiments above. Details are provided below.

In order to confirm that a nanocrystal structure is found in the tungsten oxide formed under the above film forming conditions A through E, a hard X-ray photoelectron spectroscopy (HAXPES) measurement (hereinafter simply referred to as "XPS measurement") experiment was performed. Typically, the information depth of an optical spectrum yielded by hard X-ray photoelectron spectroscopy (hereinafter simply referred to as "XPS spectrum") reflecting the average valence of the film is determined by the angle between the surface of the target of measurement and the direction in which the photoelectron is detected by the detector that ejects photoelectrons. In the present experiment, the angle between the section of photoelectrons and the surface of the tungsten oxide film during the XPS measurement was 40° in order to observe the average valence in the direction of thickness of the tungsten oxide film.

The conditions under which the XPS measurement was conducted are as follows. Note that no charge-up occurred during measurement.

Figure 5:
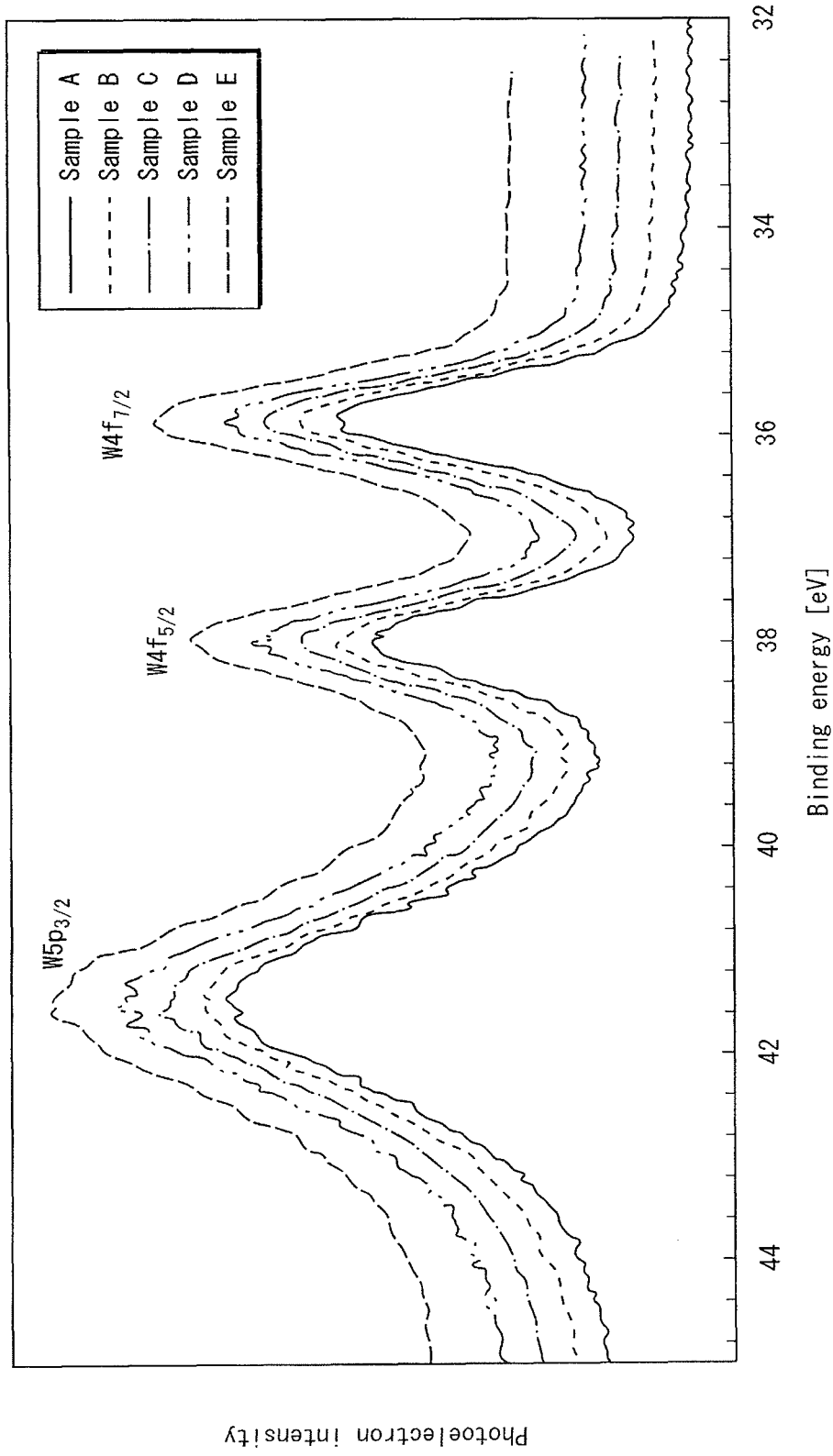
FIG. 5 shows spectra belonging to $W5p_{3/2}$, $W4f_{5/2}$, and $W4f_{7/2}$, obtained by XPS measurement of the surface of the tungsten oxide film.

XPS Measurement Conditions
  Device used: R-4000 (manufactured by VG-SCIENTA)
  Light source: synchrotron radiation (7856 eV)
  Bias: None
  Electron emission angle: angle of 40° with substrate surface
  Interval between measurement points: 0.05 eV
  Samples for XPS measurement were manufactured under the film forming conditions A through E shown in Table 1. The hole injection layer 3 was formed to a thickness of 30 nm by the above reactive sputtering method on an ITO conductive substrate formed on glass. The result was taken as the sample for XPS measurement. The samples for XPS measurement manufactured under the film forming conditions A, B, C, D, and E are hereinafter respectively referred to as sample A, sample B, sample C, sample D, and sample E. XPS measurement was then performed on the surface of the hole injection layer 3 in each of the samples A through E. FIG. 5 is a diagram illustrating the resulting spectra.

In FIG. 5, the horizontal axis represents binding energy, corresponding to the energy level of the photoelectrons at each energy level with the X-ray as a reference. The left direction with respect to the origin is positive. The vertical axis represents photoelectron intensity and corresponds to individually measured photoelectrons. As illustrated in FIG. 5, three peaks were observed. From the left side of the figure to the right, the peaks belong to the following energy levels of tungsten: $5p_{3/2}$ ($W5p_{3/2}$), $4f_{5/2}$ ($W4f_{5/2}$), and $4f_{7/2}$ ($W4f_{7/2}$).

Next, peak fitting analysis was performed on the peaks belonging to the energy levels $W5p_{3/2}$, $W4f_{5/2}$, and $W4f_{7/2}$, of the spectra for sample A and, as a comparative example, for sample E. The peak fitting analysis was performed as follows.

The peak fitting analysis was performed using XPSPEAK Version 4.1, which is software for photoelectron spectroscopy analysis. First, based on the photoionization cross-section for the hard X-ray energy of 7940 eV, the peak area intensity ratio for the energy levels $W4f_{7/2}$, $W4f_{5/2}$, and $W5p_{3/2}$ was fixed as follows: $W4f_{7/2}$:$W4f_{5/2}$:$W5p_{3/2}$=4:3:10.5. As shown in Table 4, the peak top belonging to a valence of six at the surface discontinuity energy level of $W4f_{7/2}$ ($W^{6+}4f_{7/2}$) was aligned with an energy of 35.7 eV. Next, the peak energy and the peak full width at half maximum for each of the peaks belonging to the surface photoelectron peak ($W^{sur}5p_{3/2}$) a valence of six at the surface discontinuity energy level ($W^{6+}5p_{3/2}$), and a valence of five at the surface discontinuity energy level ($W^{5+}5p_{3/2}$) of $W5p_{3/2}$ were set to the values listed in Table 4. Similarly, for $W4f_{5/2}$ and $W4f_{7/2}$, the peak energy and the peak full width at half maximum for each of the peaks belonging to the surface photoelectron peak ($W^{sur}4f_{5/2}$, $W^{sur}4f_{7/2}$), a valence of six at the surface discontinuity energy level ($W^{6+}4f_{5/2}$), and a valence of five at the surface discontinuity energy level ($W^{5+}4f_{5/2}$, $W^{5+}4f_{7/2}$) were set to the values listed in Table 4. After setting the peak intensities to a desired value, calculations were performed a maximum of 100 times using a Gaussian-Lorentzian mixed function to obtain the final peak fitting analysis results. In the mixed function, the ratio in the Lorentzian function was set as indicated in Table 4.

TABLE 4

| Corresponding peak | $W5p_{3/2}$ | | | $W4f_{5/2}$ | | | $W4f_{7/2}$ | | |
| --- | --- | --- | --- | --- | --- | --- | --- | --- | --- |
| | $W^{sur}5p_{3/2}$ | $W^{6+}5p_{3/2}$ | $W^{5+}5p_{3/2}$ | $W^{sur}4f_{5/2}$ | $W^{6+}4f_{5/2}$ | $W^{5+}4f_{5/2}$ | $W^{sur}4f_{7/2}$ | $W^{6+}4f_{7/2}$ | $W^{5+}4f_{7/2}$ |
| Peak Energy (eV) | 42.30 to 43.07 | 41.20 to 41.30 | 39.70 to 38.65 | 38.75 to 39.13 | 37.80 to 37.85 | 36.72 to 36.95 | 36.60 to 36.90 | 35.70 (reference) | 34.60 to 34.80 |
| Value of full width at half maximum (eV) | 1.73 to 2.40 | 1.93 to 2.24 | 1.8 to 2.86 | 1.40 to 1.60 | 0.87 to 0.98 | 0.90 to 1.50 | 1.40 to 1.60 | 0.87 to 0.98 | 0.90 to 1.50 |
| Lorentzian function ratio (%) | 0 | 13 to 40 | 0 to 25 | 0 to 57 | 0 to 6 | 0 to 20 | 0 to 57 | 0 to 6 | 0 to 20 |

Figure 6A:
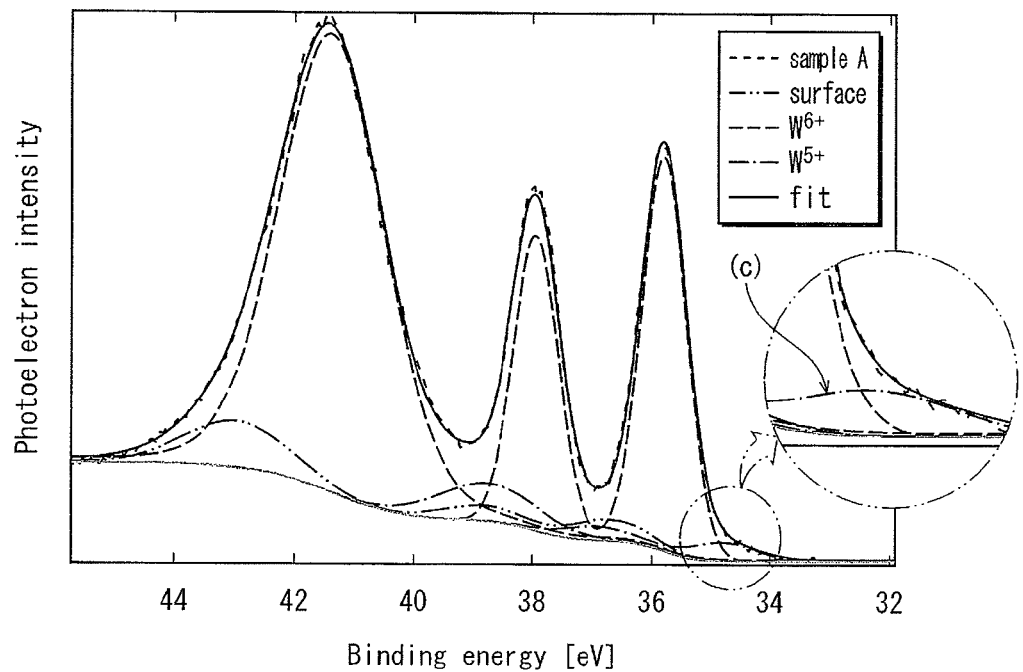
FIG. 6A shows peak fitting analysis results for sample A in FIG. 5.
Figure 6B:
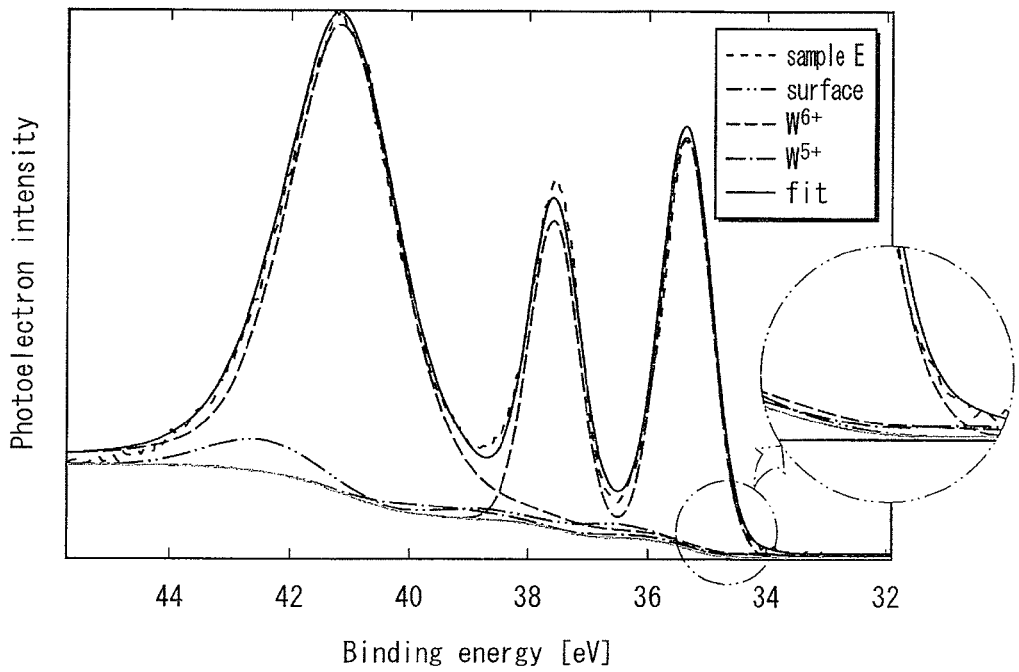
FIG. 6B shows peak fitting analysis results for sample E.

FIGS. 6A and 6B show the final peak fitting analysis results. FIG. 6A shows the analysis results for sample A, and FIG. 6B shows the analysis results for sample E.

In both FIGS. 6A and 6B, the dashed lines (sample A, sample E) are actual measured spectra (corresponding to the spectra in FIG. 5), the lines with alternate long and two short dashes (surface) are the spectra belonging to the surface photoelectron peaks of $W^{sur}5p_{3/2}$, $W^{sur}4p_{5/2}$, and $W^{sur}4p_{7/2}$, the dotted lines ($W^{6+}$) are the spectra belonging to a valence of six at the surface discontinuity energy level of $W^{6+}5p_{3/2}$, $W^{6+}4f_{7/2}$, and $W^{6+}4f_{5/2}$, and the alternating long and short dashed lines ($W^{5+}$) are the spectra belonging to a valence of five at the surface discontinuity energy level of $W^{5+}5p_{3/2}$, $W^{5+}4f_{5/2}$, and $W^{5+}4f_{7/2}$. The solid lines (fit) are the spectra yielded by summing the spectra indicated by the lines with alternate long and two short dashes and the alternating long and short dashed lines. Note that in FIGS. 6A and 6B, the peak belonging to the tungsten with a valence of five indicated by the alternating long and short dashed line is considered to derive only from tungsten with a valence of five.

As illustrated in FIGS. 6A and 6B, the spectra belonging to the energy levels $5p_{3/2}$, $4f_{5/2}$, and $4f_{7/2}$ are constituted by a sum of the peak due to photoelectrons from the surface of the hole injection layer 3 (surface), the peak of tungsten atoms with a valence of six included at the depth at which photoelectrons are detected within the hole injection layer 3 ($W^{6+}$), and the peak of tungsten atoms with a valence of five included at the same depth ($W^{5+}$).

Furthermore, FIG. 6A shows that for sample A, a peak for $W^{5+}$ corresponding to each energy level occurs in a binding energy region that is 0.3 eV to 1.8 eV lower than each of the peaks belonging to the energy levels $5p_{3/2}$, $4f_{5/2}$, and $4f_{7/2}$ in the $W^{6+}$ spectra. On the other hand, in FIG. 6B, no such peak for $W^{5+}$ is evident for sample E. For the purposes of illustration, the peak belonging to $4f_{7/2}$ in the $W^{5+}$ spectrum for sample A and for sample E is shown enlarged to the right of FIGS. 6A and 6B. As shown in (c) of FIG. 6A, the peak for $W^{5+}$ is clearly observable for sample A, whereas no such peak for $W^{5+}$ is observable for sample E.

Furthermore, looking more closely at the enlarged diagrams in FIGS. 6A and 6B, the solid line (fit), which is the summed spectrum resulting from peak fitting, exhibits a large "shift" in sample A with respect to the spectrum for $W^{6+}$ indicated by the dotted line ($W^{6+}$). In sample E, however, the "shift" is not as large as in sample A. In other words, the "shift" in sample A can be inferred as suggestive of the existence of tungsten atoms with a valence of five.

Next, for samples A through E, the abundance ratio $W^{5+}/W^{6+}$ of the number of tungsten atoms with a valence of five versus the number of tungsten atoms with a valence of six was calculated. The abundance ratio was calculated, in the spectrum obtained through peak fitting analysis on each sample, by dividing the area intensity of the peak for $W^{5+}$ (alternating long and short dashed line) by the area intensity of the peak for $W^{6+}$ (dotted line).

Note that in principle, representing the abundance ratio of the number of tungsten atoms with a valence of six to the number of tungsten atoms with a valence of five as the ratio of the area intensity of the peak for $W^{6+}$ to the area intensity of the peak for $W^{5+}$ in $W4f_{7/2}$ is equivalent to representing the abundance ratio based on the peaks belonging to $W5p_{3/2}$ and $W4f_{5/2}$. In the present experiment, it was confirmed that the ratio of the area intensity of $W^{5+}4f_{7/2}$ to the area intensity of $W^{6+}4f_{7/2}$ in $W4f_{7/2}$ was indeed the same value for W5p and for $W4f_{5/2}$ as well.

Accordingly, in the following analysis, only the peak belonging to $W4f_{7/2}$ is considered.

Table 5 shows the ratio $W^{5+}/W^{6+}$ for samples A through E.

TABLE 5

| Name of Sample | $W^{5+}/W^{6+}$ |
|---|---|
| Sample A | 7.4% |
| Sample B | 6.1% |
| Sample C | 3.2% |
| Sample D | 3.2% |
| Sample E | 1.8% |

Based on the values of $W^{5+}/W^{6+}$ in Table 5, it was confirmed that the sample including the most tungsten atoms with a valence of five was sample A, followed by samples B, C, and D in decreasing order. Furthermore, based on the results in Table 3 and Table 5, it became clear that as the value of $W^{5+}/W^{6+}$ increases, the driving voltage of the organic EL element decreases.

Electronic State of Tungsten in the Hole Injection Layer 3

The tungsten oxide film formed under the above film forming conditions A through D has, in an electronic state thereof, an occupied energy level in a binding energy region that is between 1.8 eV and 3.6 eV lower than the upper end of the valence band, i.e. the lowest binding energy of the valence band. This occupied energy level corresponds to the highest occupied energy level of the hole injection layer 3, and the binding energy range thereof is closest to the Fermi surface of the hole injection layer 3. The occupied energy level is hereinafter referred to as "the occupied energy level near the Fermi surface".

Due to the existence of this occupied energy level near the Fermi surface, a so-called interface energy level alignment is formed at the layer interface between the hole injection layer 3 and the buffer layer 4, so that the binding energy of the highest occupied molecular orbital of the buffer layer 4 and the binding energy of the occupied energy level near the Fermi surface of the hole injection layer 3 become approximately equal. In other words, due to the existence of the occupied energy level, the hole injection barrier between the hole injection layer 3 and the buffer layer 4 is reduced. This allows for even better hole conduction efficiency as well as driving at a lower voltage.

Note that the expressions "approximately equal to" and "interface energy level alignment is formed" as referred to herein indicate that at the interface between the hole injection layer 3 and the buffer layer 4, the difference between the lowest binding energy at the occupied energy level near the Fermi surface and the lowest binding energy at the highest occupied molecular orbital is ±0.3 eV.

Furthermore, the expression "interface" as referred to here denotes an area that includes a surface of the hole injection layer 3 and a portion of the buffer layer 4 within a distance of 0.3 nm from the surface of the hole injection layer 3.

While it is desirable that the occupied energy level near the Fermi surface exist throughout the hole injection layer 3, it suffices for this occupied energy level to exist at the interface with the buffer layer 4.

Next, experiments to confirm the existence of the occupied energy level near the Fermi surface in the hole injection layer 3 of sample A and sample E were performed using ultraviolet photoelectron spectroscopy (UPS) measurement.

The forming of the hole injection layer 3 in sample A and sample E was performed inside a sputtering device. Then, to prevent atmospheric exposure, samples A and E were transported to a glovebox which was connected to the sputtering device and which was filled with nitrogen gas. Subsequently, the samples were sealed inside transfer vessels in the glovebox, and were mounted on a photoelectron spectroscopy device. After formation, the hole injection layer 3 was therefore not exposed to the atmosphere before UPS measurement was performed.

In general, a UPS spectrum obtained as a result of the UPS measurement reflects a state of occupied energy levels, such as a valence band and the like, within several nanometers in distance from the surface of the target of measurement. As such, the present experiment was conducted in order to observe the state of occupied energy levels at a surface portion of the hole injection layer 3 by utilizing UPS measurement.

The conditions under which the UPS measurement was conducted are as follows. Note that charge-up did not occur during measurement.

UPS Measurement Conditions

Device used: PHI 5000 VersaProbe Scanning X-ray Photoelectron Spectroscopy Device (manufactured by ULVAC-PHI, Inc.)

Light source: He I line

Bias: None

Electron emission angle: Direction of normal line to the substrate

Interval between measurement points: 0.05 eV

Figure 7:
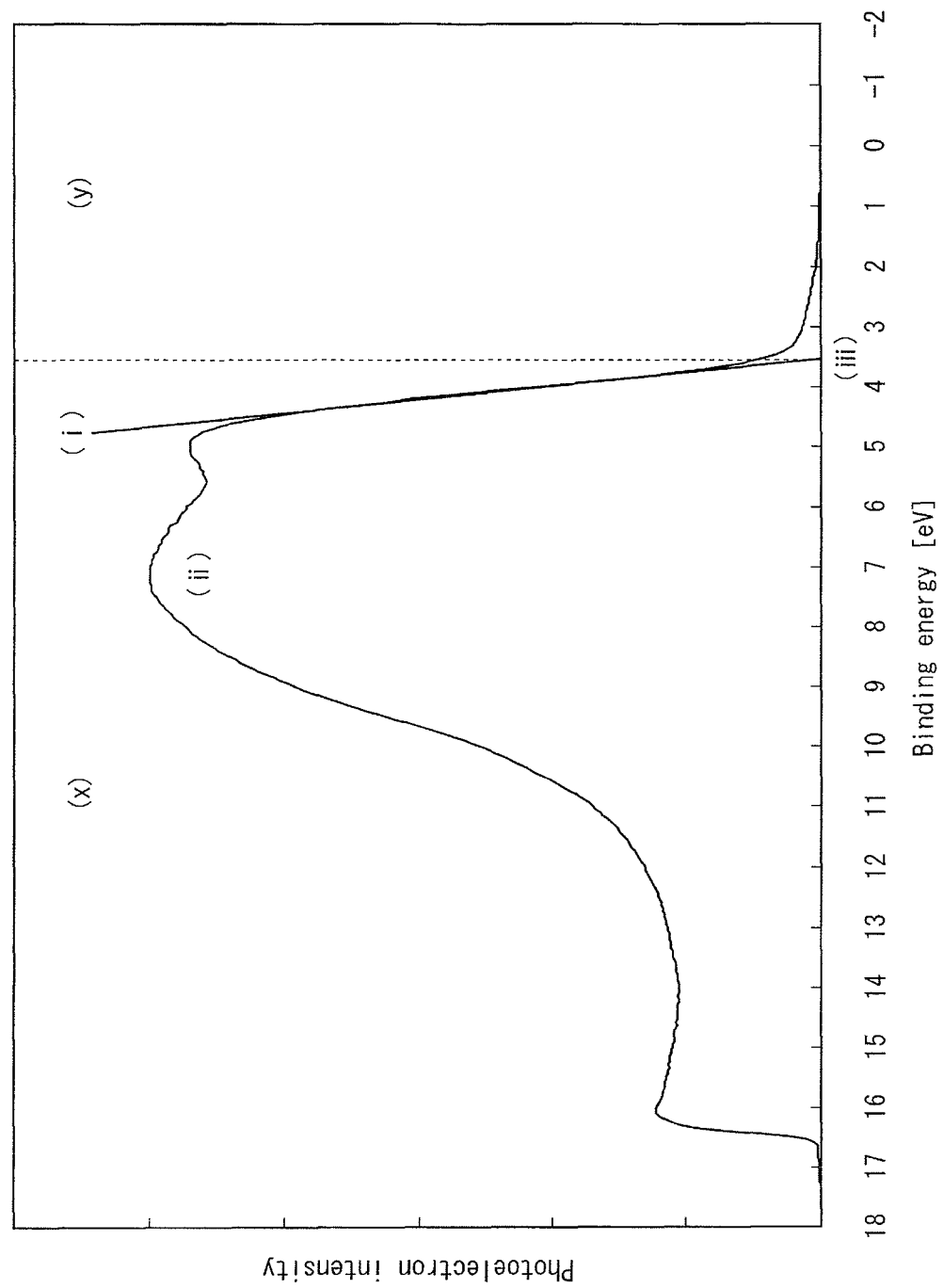
FIG. 7 is a diagram illustrating a UPS spectrum of the surface of a tungsten oxide film.

FIG. 7 is a diagram illustrating a UPS spectrum of the hole injection layer 3 of sample A. The origin of the horizontal axis, which represents binding energy, corresponds to the Fermi surface of the substrate 7, and the left direction with respect to the origin is positive. Each of the occupied energy levels of the hole injection layer 3 is now described with reference to FIG. 7.

Commonly, a UPS spectrum of tungsten oxide indicates a distinct, rapid rise which can be uniquely distinguished from other areas thereof. Here, a tangential line passing through an inflection point of the above rise is referred to as line (i), and the point at which line (i) intersects the horizontal axis is referred to as point (iii). The UPS spectrum of tungsten oxide can be divided into two areas: area x that extends in the high binding energy direction from point (iii), and area y that extends in the low binding energy direction (i.e. towards the Fermi surface) from point (iii).

Using the same XPS measurement as described above, it was confirmed that the ratio of the number of tungsten atoms to the number of oxygen atoms was nearly 1:3 in both of the samples A and E. Specifically, the composition ratio of tungsten to oxygen within several nanometers in distance from the surface of the hole injection layer 3 was estimated.

Based on this ratio, it can be concluded that in both samples A and E, the hole injection layer 3 has a basic structure with atomic coordinates based on tungsten trioxide (details are provided in the following section), at least to a depth of several nanometers from the surface. Accordingly, region x in FIG. 7 corresponds to an occupied energy level deriving from the above basic structure, i.e. a region corresponding to a so-called valence band. Note that the inventors performed X-ray absorption fine structure (XAFS) measurement with respect to the hole injection layer 3 of both samples A and E and confirmed that the above basic structure is formed therein.

Accordingly, the area y illustrated in FIG. 7 corresponds to a band gap between the valence band and the conduction band. It is commonly known, however, that an occupied energy level that differs from the occupied energy level of the valence band may exist in this area of the tungsten oxide, as is suggested by the UPS spectrum in FIG. 7. This occupied energy level in area y derives from another structure that is different from the above-mentioned basic structure, and is referred to as a band gap energy level (in-gap state or gap state).

Figure 8:
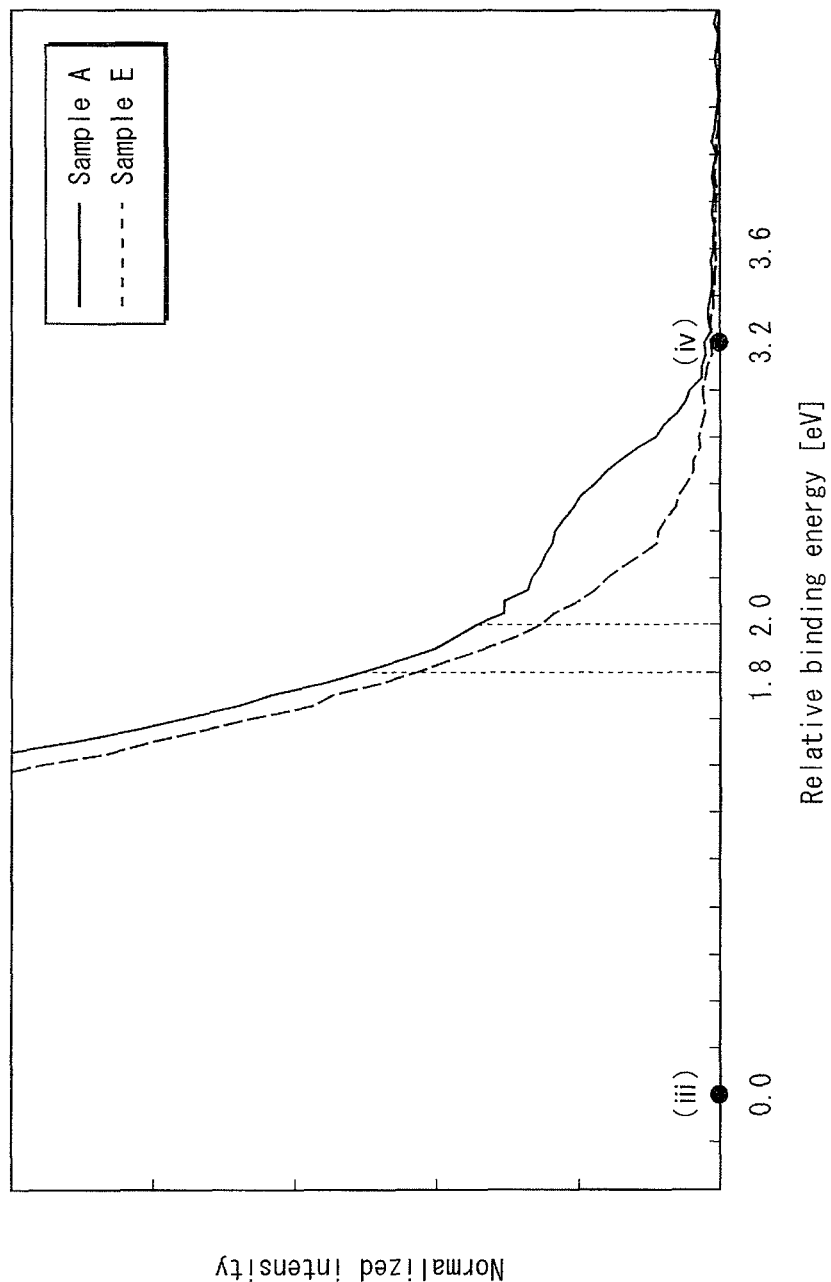
FIG. 8 is a diagram illustrating UPS spectra of the surface of a tungsten oxide film.

Next, FIG. 8 is a diagram illustrating a UPS spectrum of the hole injection layer 3 in samples A and E within area y. The spectrum intensity indicated by the vertical axis in FIG. 8 has been normalized using the peak-top intensity value of a peak (ii) in FIG. 7, which is located approximately between 3 eV and 4 eV in the high binding energy direction from point (iii). In addition, note that point (iii) in FIG. 8 is illustrated at the same point on the horizontal axis as in FIG. 7. In FIG. 8, the horizontal axis indicates a relative value (relative binding energy) with respect to point (iii), and the binding energy decreases from left to right (towards the Fermi surface).

As illustrated in FIG. 8, the spectrum indicating the hole injection layer 3 of sample A exhibits a peak in an area between a point which is 3.6 eV lower in terms of binding energy than point (iii) and a point which is 1.8 eV lower in terms of binding energy than point (iii). The point at which this peak clearly begins is labeled as point (iv) in FIG. 8. The existence of such a peak is not observed in the spectrum for sample E.

Forming the hole injection layer from tungsten oxide having a structure such that the UPS spectrum thereof indicates an upward protrusion (not necessarily in the form of a peak) in an area which is between 1.8 eV and 3.6 eV lower in terms of binding energy than point (iii) provides the organic EL element with excellent hole conduction efficiency.

Furthermore, it has been found that hole injection efficiency increases when this upward protrusion has a higher degree of sharpness. Therefore, as illustrated in FIG. 8, it can be said that the area that is between 2.0 eV and 3.2 eV lower than point (iii) in terms of binding energy is particularly important, since the upward protrusion is relatively easier to confirm in this area and has a relatively sharper inclination.

Relationship Between Value of $W^{5+}/W^{6+}$ and Driving Voltage

Figure 9:
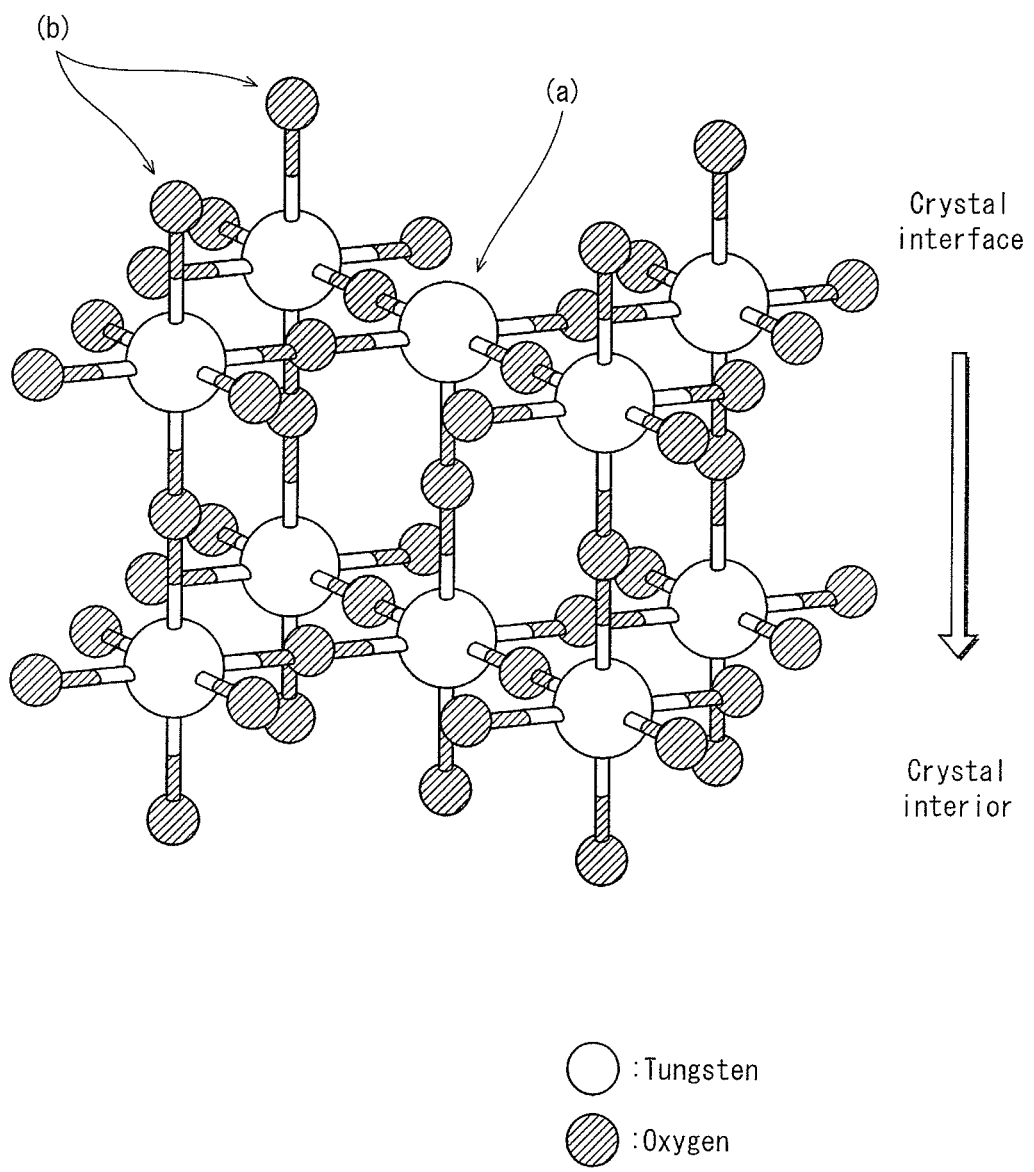
FIG. 9 is a diagram illustrating the structure along the surface of the tungsten oxide film.

FIG. 9 is a diagram illustrating the structure along the surface of the tungsten oxide film. In this figure, tungsten trioxide (WO3) is used as an example of tungsten oxide. As illustrated in FIG. 9, tungsten atoms are surrounded by six oxygen atoms to form an octahedron with the six oxygen atoms at the vertices. The octahedrons share the vertices and connect to each other. For the sake of simplicity, in this figure the octahedrons are drawn as regular octahedrons, such as the rhenium oxide structure. In practice, the octahedrons themselves are somewhat distorted but they order periodically.

As illustrated in FIG. 9, tungsten atoms are terminated by oxygen atoms within the crystal, whereas at the crystal interface, two types of tungsten atoms are thought to exist: tungsten atoms (b) surrounded by terminal oxygen atoms, and tungsten atoms (a) not terminated in this way. Non-Patent Literature 4 reports how first principles calculation reveals that a structure periodically exhibiting a portion of tungsten atoms (a) that are not terminated, as in FIG. 9, is more stable in terms of energy then when all tungsten atoms are terminated in oxygen atoms. The reason for this is that when all of the tungsten atoms at the crystal interface are terminated in oxygen atoms, the electric repulsive force between terminal oxygen atoms increases, which results in a loss of stability. In other words, at the crystal interface, a structure (a) similar to an oxygen vacancy along the surface is more stable.

Tungsten atoms terminated in oxygen atoms, i.e. tungsten atoms not having the structure (a) similar to an oxygen vacancy, correspond to tungsten atoms with a valence of six. On the other hand, tungsten atoms not terminated in oxygen atoms, i.e. tungsten atoms having the structure (a) similar to an oxygen vacancy, correspond to tungsten atoms with a valence of five (including a valence of at least five and less than six).

Tungsten atoms with a valence of five are considered to have a structure with a lone pair of electrons due to the loss of one oxygen atom in octahedral coordination. In other words, it is thought that a tungsten atom with a valence of five supplies a hole with its own lone pair of electrons, so that the tungsten atom with a valence of five that supplied the electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. The hole injection layer 3 having a high value for $W^{5+}/W^{6+}$ in sample A, i.e. a high ratio of tungsten atoms with the valence of five, thus has abundant hole conduction paths, allowing for driving at a low voltage due to hole conduction at a low voltage. As a result, the organic EL element has excellent hole conduction efficiency.

Furthermore, in samples C and D, while the value of $W^{5+}/W^{6+}$ was not as high as sample A, good hole conduction was confirmed even at a value of approximately 3.2%.

Microstructure of Tungsten in the Hole Injection Layer 3

The tungsten oxide film constituting the hole injection layer 3 has a nanocrystal structure. This nanocrystal structure is formed by adjusting the film forming conditions. Details are provided below.

In order to confirm the existence of the nanocrystal structure in the tungsten oxide film formed under film forming conditions A, B, C, D, and E listed in Table 1, a transmission electron microscope (TEM) measurement experiment was performed.

The tungsten oxide layer in the sample for TEM measurement was formed by the reactive sputtering method using a DC magnetron sputtering device under each set of conditions listed in Table 1. To form each sample, the hole injection layer 3 was formed to a thickness of 30 nm by the above reactive sputtering method on an ITO conductive substrate formed on glass. The samples for TEM measurement manufactured under the film forming conditions A, B, C, D, and E are hereinafter respectively referred to as sample A, sample B, sample C, sample D, and sample E. Note that TEM measurement was performed after confirming, by the above XPS measurement, that tungsten atoms with a valence of five were included in each of the samples A, B, C, and D.

Typically, TEM measurement is performed on a surface by forming a thin sample. A sample according to the present embodiment was manufactured as a cross-section of the tungsten oxide film by using a focused ion beam (FIB) device to process the sample and adjust the thickness of to approximately 100 nm. The conditions for FIB processing and TEM measurement are as follows.

Figure 10:
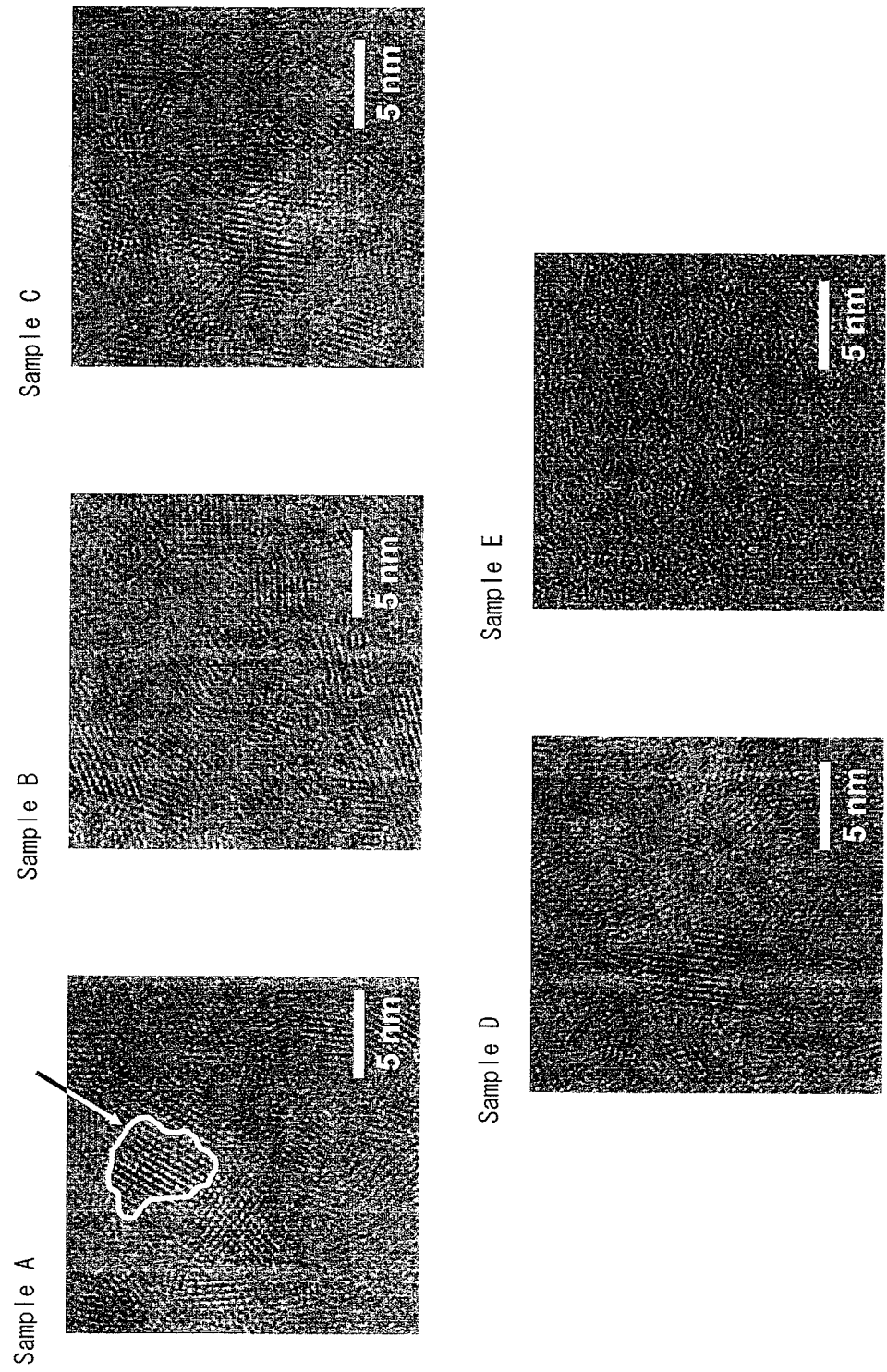
FIG. 10 shows cross-sectional TEM photographs of a tungsten oxide film.

Conditions for FIB Processing
 Device used: Quanta200 (manufactured by FEI Company)
 Accelerating voltage: 30 kV (final voltage: 5 kV)
 Thickness of sample: 50 nm or less Conditions for TEM Measurement
 Device used: Topcon EM-002B (manufactured by Topcon Technohouse Corporation)
 Measurement method: high-resolution electron microscopy
 Accelerating voltage: 200 kV FIG. 10 is a diagram illustrating a TEM measurement photograph of a cross-section of the hole injection layer 3 in samples A, B, C, D, and E. The scale is indicated by the scale bar in each TEM photograph, and the display size of each TEM photograph is 560×560 pixels. The TEM photographs in FIG. 10 are shown with 256 gradations from the darkest to the brightest region.

In the TEM photographs in FIG. 10, regular linear structures can be observed in samples A, B, C, and D based on how bright regions are partially aligned in the same direction. As is clear from the scale of the TEM photographs, these linear structures are provided at intervals of approximately 1.85 angstroms to 5.55 angstroms.

On the other hand, the bright regions are scattered irregularly in sample E, with no regular linear structures being observable. In the TEM photographs, regions with the above linear structures represent one nanocrystal of tungsten oxide. The TEM photographs thus confirm the presence of the nanocrystal structure of tungsten oxide in samples A, B, C, and D. On the other hand, no nanocrystal structure could be confirmed in sample E.

In the TEM photograph of sample A in FIG. 10, one of the nanocrystals, chosen arbitrarily, is outlined with a white line. Note that this outline is not precise, but rather is meant to be an example. This is because the TEM photograph shows not only the uppermost surface in the cross-section, but also the conditions lower in the layer, thus making it difficult to precisely identify the outline. The size of the nanocrystal outlined with a white line in sample A is approximately between 3 nm and 10 nm.

Figure 11:
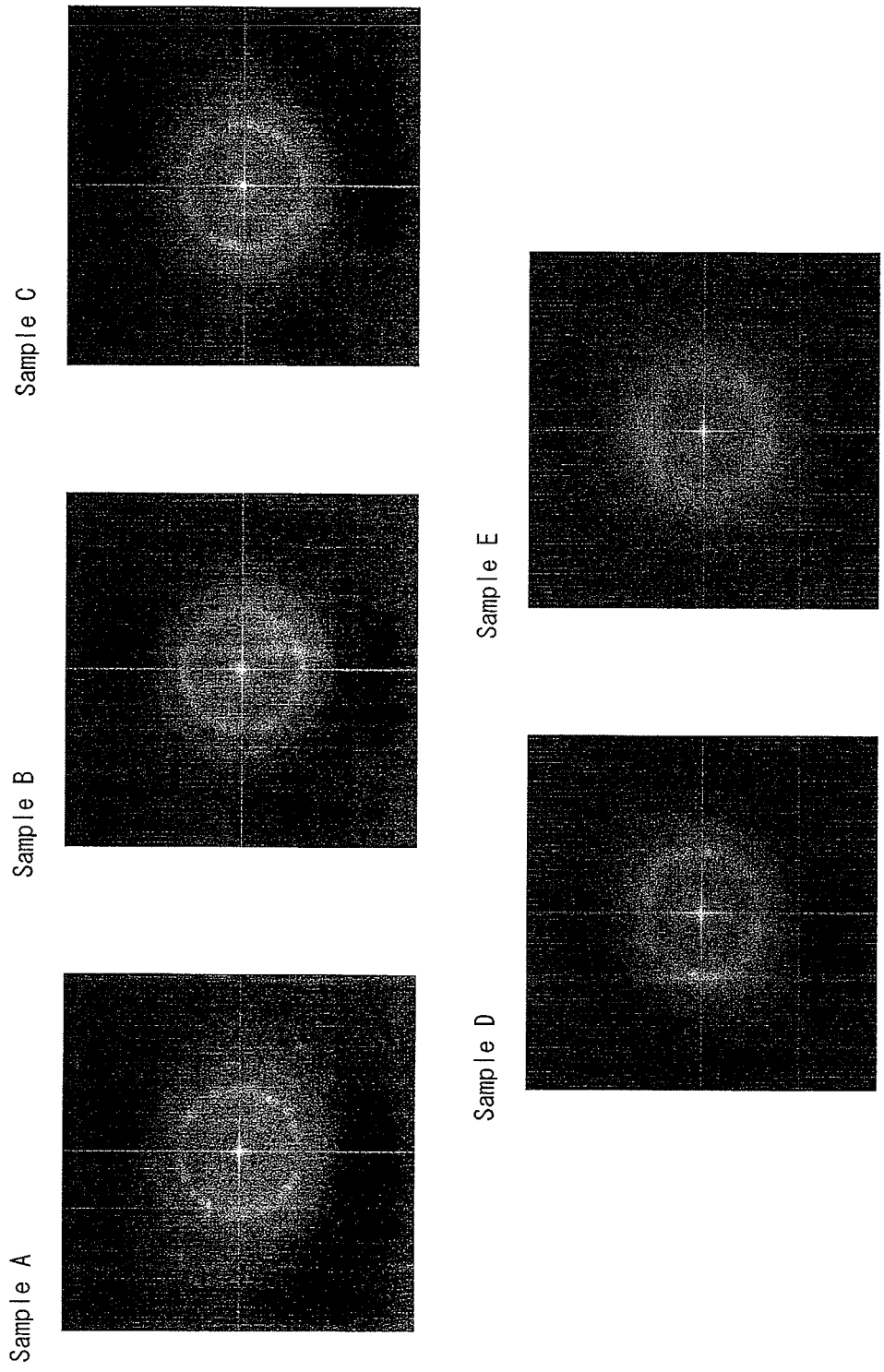
FIG. 11 shows 2D Fourier transform images for the TEM photographs shown in FIG. 10.

FIG. 11 shows 2D Fourier transform images indicating the results of a 2D Fourier transform on the TEM measurement photographs in FIG. 10. The 2D Fourier transform images shown in FIG. 11 have a distribution indicating a reciprocal lattice space of the TEM measurement photographs in FIG. 10. The 2D Fourier transform images in FIG. 11 were created by performing a Fourier transform on the TEM photographs of FIG. 10 using LAview Version #1.77, which is image processing software. In the Fourier transform images in FIG. 11, a bright region formed by two or three concentric circles centering on a center point of the Fourier transform images appears for samples A, B, C, and D. While a bright region formed by concentric circles in the Fourier transform image can be confirmed for samples A, B, C, and D, an unclear circle appears in sample E. The lack of clarity of the bright region formed by concentric circles indicates a qualitative loss of order in the structure of the hole injection layer 3 in FIG. 10. In other words, samples A, B, C, and D, for which a bright region formed by concentric circles can be confirmed, are highly ordered, whereas sample E exhibits a loss of order.

Figure 12A:
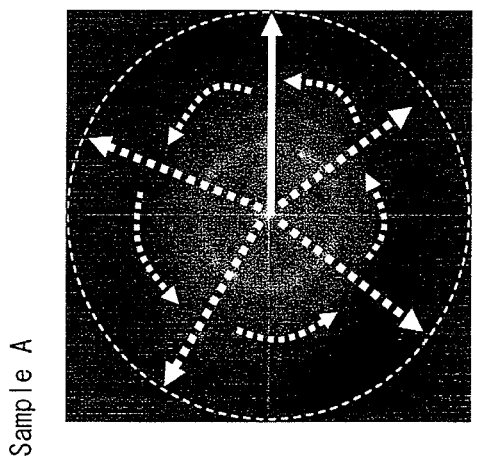
FIGS. 12A and 12B are diagrams illustrating the creation of a plot of change in luminance from the 2D Fourier transform image shown in FIG. 11.
Figure 12B:
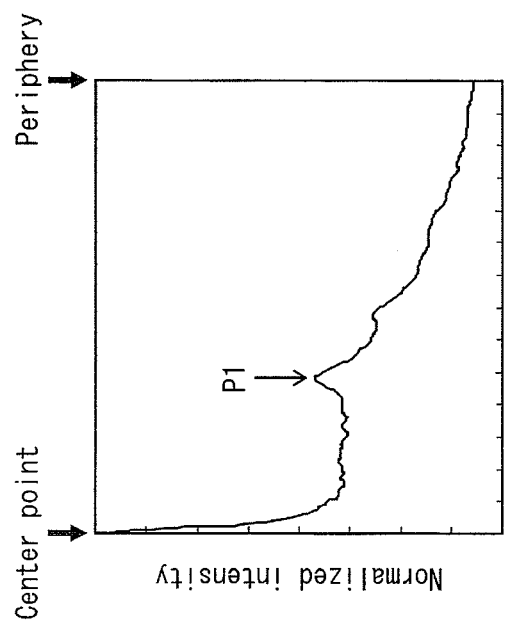

Next, graphs showing the change in luminance vs. the distance from the center point of the image to the outer edge were created from the 2D Fourier transform images in FIG. 11. FIGS. 12A and 12B show an outline of the method of creating the graphs, using sample A as an example.

As illustrated in FIG. 12 A, the Fourier transform image was rotated 1° at a time around the center point, and the luminance versus the distance from the center point of the Fourier transform image to the outer edge of the photograph along the X-axis was measured. The Fourier transform image was rotated from 0° to 359°, and the distance from the center point of the Fourier transform image (horizontal axis) and the normalized luminance of the Fourier transform image (vertical axis) were integrated over each 1° rotation of the Fourier transform image and divided by 360 to yield the graph shown in FIG. 12B. Microsoft Office Picture Manager was used to rotate the images, and the image processing software ImageNos was used to measure the distance from the center point and the luminance of the Fourier transform image. Hereinafter, the plot created using the method described with reference to FIGS. 12A and 12B is referred to as a "plot of change in luminance".

FIGS. 13 and 14 illustrate the plots of change in luminance for samples A, B, C, D, and E. The plots of changes in luminance for samples A, B, C, D, and E clearly evidence a peak, labeled P1, other than a high luminance region at the center point of each sample. Hereinafter, the peak of the normalized luminance appearing nearest the center point in the plot of change in luminance is referred to as a "peak P1". Furthermore, as compared to the peak P1 in sample E, the peak P1 in samples A, B, C, and D has a sharply convex structure.

Next, the sharpness of the peak P1 in samples A, B, C, D, and E was assessed. FIGS. 15A and 15B show an outline of the method of assessment, using samples A and E as examples.

FIGS. 15A and 15B are plots of change in luminance for samples A and E respectively. In FIGS. 15A and 15B, (a1) and (b1) are enlarged diagrams of the peak P1 and the surrounding region in each sample. The "peak width L of the peak P1", indicated by "L" in (a1) and (b1) of FIGS. 15A and 15B, is used as an index of how "pointed" the peak P1 is.

In order to more accurately determine this "peak width L of the peak P1", the first derivative of the plot in (a1) and (b1) in FIGS. 15A and 15B is shown in (a2) and (b2) in FIGS. 15A and 15B. In (a2) and (b2) in FIGS. 15A and 15B, the peak width L is the difference between the value along the horizontal axis corresponding to the peak top of the peak P1 and the value along the horizontal axis, in the direction of the center point from the peak, corresponding to the position at which the derivative first becomes zero. Table 6 shows the values of the peak width L in samples A, B, C, D, and E, with the value along the horizontal axis corresponding to the center point in the Fourier transform image and the peak top of the peak P1 normalized as 100.

TABLE 6

| Name of Sample | Peak Width L |
|---|---|
| Sample A | 16.7 |
| Sample B | 18.1 |
| Sample C | 21.3 |
| Sample D | 21.9 |
| Sample E | 37.6 |

As illustrated in Table 6, the peak width L is the smallest in sample A and increases in order in samples B, C, and D, reaching its maximum value in sample E. Furthermore, in samples C and D, while the value of the peak width L was not as high as sample A, good hole conduction was confirmed even at a value of approximately 21.9.

The values of the peak width L listed in Table 6 indicate the clarity of the bright region formed by the concentric circle closest to the center point in the Fourier transform images of FIG. 11. As the value of the peak width L decreases, the extent of the bright region formed by concentric circles is smaller, indicating a greater level of regularity in the TEM photograph of the hole injection layer 3 in FIG. 10. Conversely, as the value of the peak width L is larger, the extent of the bright region formed by the concentric circle closest to the center point in the Fourier transform images of FIG. 11 is larger, indicating a loss of regularity in the microstructure in the TEM photograph of the hole injection layer 3 in FIG. 10.

As described with reference to FIG. 9, the basic structure of a single crystal tungsten oxide consists of periodically ordered connections of octahedrons. A nanocrystal structure is formed by a number of such single crystals, i.e. nanocrystals. Because the inside of these nanocrystals has a high level of regularity, it can be concluded that tungsten atoms with a valence of five are found not within nanocrystals, but rather along the surface of nanocrystals.

Based on the results of Tables 5 and 6, as the level of regularity in the film structure of the tungsten oxide film decreases, the ratio of tungsten atoms with a valence of five clearly decreases. The reasons for this relationship are considered to be as follows.

In the tungsten oxide film manufactured under film forming conditions E, the above-described nanocrystals may exist, but most of the film is considered to be an amorphous structure. In the amorphous structure, most octahedrons are connected to each other throughout the film, though nonperiodically and disorderly. Only a few discontinuities exist along the sequence of octahedron connections, so there are few grain boundaries which can contain oxygen vacancies, resulting in a low ratio of tungsten atoms with a valence of five. Consequently, the film lacks locations that become hole conduction paths, making driving at a low voltage difficult. On the other hand, in the tungsten oxide film manufactured under film forming conditions A through D, the nanocrystals lie next to each other throughout the entire film, constituting the sequence of nanocrystal surfaces/interfaces. Because the periodically ordered octahedron connections in the nanocrystals end at their surfaces/interfaces, there exist tungsten atoms with a valence of five on the surfaces/interfaces, and they act as hole conduction paths, allowing for driving at low voltage.

Analysis of Hole Conduction of Injected Holes

As described above, the basic structure of a single crystal tungsten oxide consists of periodically ordered connections of octahedrons. When the film is formed from octahedron connections without order and periodicity, an amorphous structure results, whereas forming the film from octahedron connections with order and periodicity results in a nanocrystal structure.

When tungsten atoms with a valence of five are present in the tungsten oxide film, the tungsten atoms are considered to form a structure with a lone pair of electrons when one of the oxygen atoms in octahedral coordination with a tungsten atom is lost. In other words, it is thought that a tungsten atom with a valence of five supplies a hole with its own lone pair of electrons, so that the tungsten atom with a valence of five that supplied the lone pair of electrons has a hole. Due to the bias voltage applied to the hole injection layer, this provision of an electron from a lone pair of electrons existing in a tungsten atom with a valence of five is thought to occur continuously, leading to hole conduction in which holes move in the direction of lower electric potential and electrons move in the direction of higher electric potential. Accordingly, as more tungsten atoms with a valence of five are included, more tungsten atoms contribute to hole conduction, thus increasing the hole conduction efficiency. The inclusion of numerous tungsten atoms with a valence of five, however, is not a sufficient condition for improving hole conduction properties. The reasons for this are described with reference to FIGS. 16A and 16B.

Figure 16A:
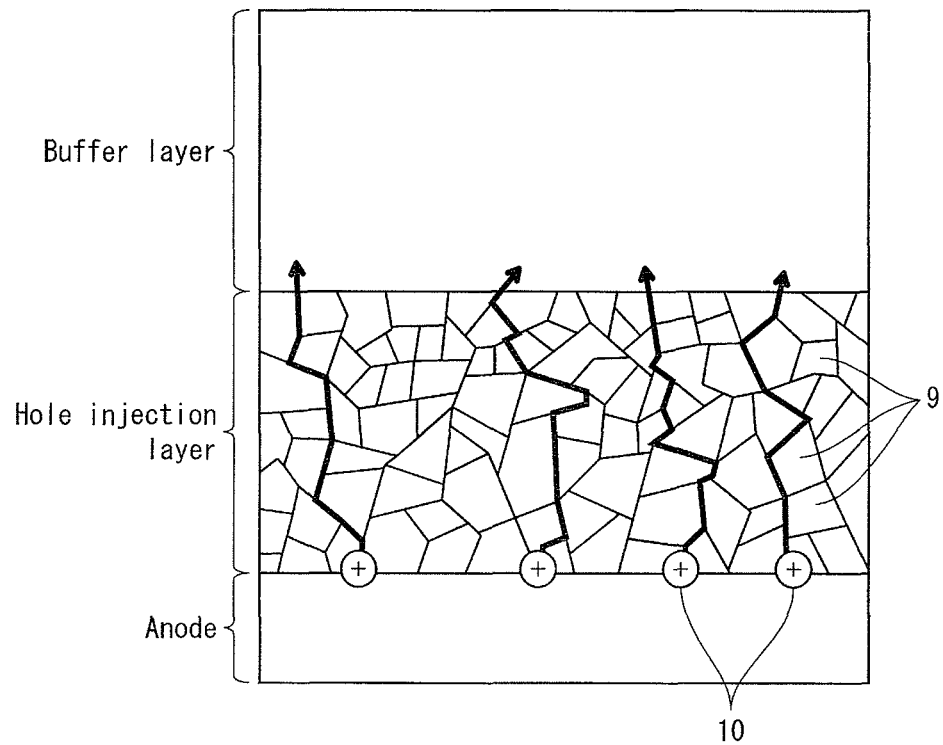
FIG. 16A is a diagram schematically illustrating hole conduction in a nanocrystal structure.
Figure 16B:
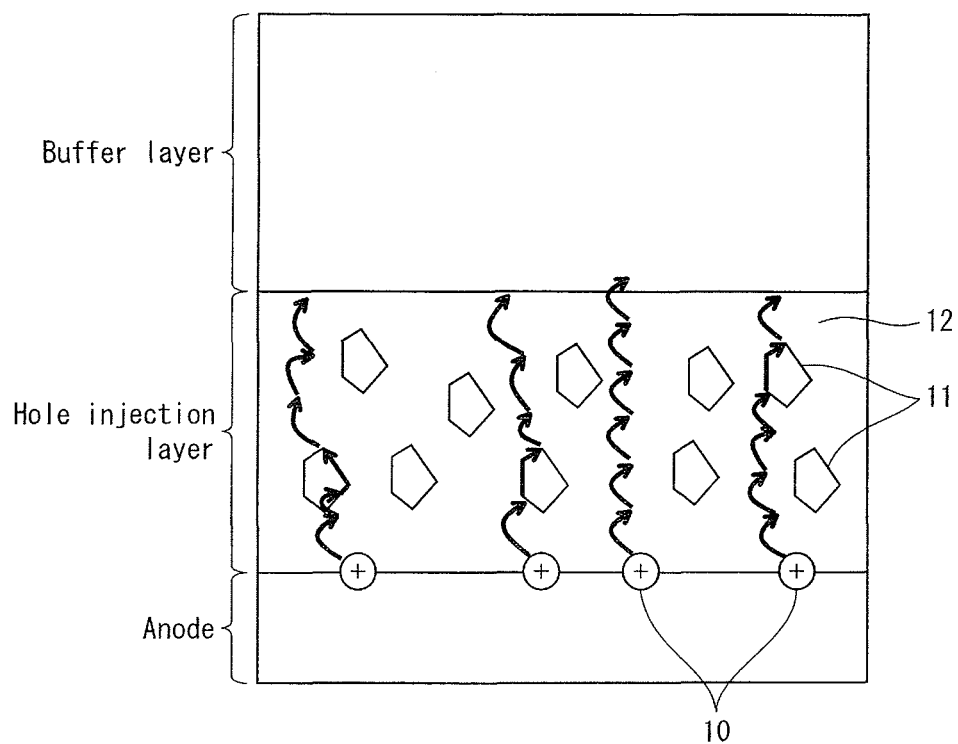
FIG. 16B is a diagram schematically illustrating hole conduction in an amorphous structure of a tungsten oxide film.

FIG. 16B is a conceptual diagram of conduction of holes 10 by hopping conduction, illustrating conduction of holes 10 through an amorphous structure. In the amorphous structure illustrated in FIG. 16B, the portions labeled 11 are crystals with a well-ordered rutile structure (segregated crystals 11). Numerous tungsten atoms with a valence of five are found along the surface of the segregated crystals 11. On the other hand, region 12 excluding the segregated crystals 11 is an amorphous portion in which rutile structures are not well ordered. Not as many tungsten atoms with a valence of five exist as along the surface of the segregated crystals 11. In the amorphous structure, although tungsten atoms with a valence of five exist along the surface of the segregated crystals 11, the orbital of a tungsten atom with the valence of five does not overlap with the orbital of another nearby tungsten atom with a valence of five. Therefore, the holes 10 are thought to be conducted by hopping between tungsten atoms with a valence of five. In other words, in an amorphous structure, tungsten atoms with a valence of five are separated by a long distance. In order to exchange holes between tungsten atoms with the valence of five, which act as hole conduction locations, it becomes necessary to apply an extremely high-voltage across the tungsten atoms with a valence of five, thereby increasing the driving voltage of the element.

By contrast, FIG. 16A is a conceptual diagram showing the conduction of holes 10 along the surface of nanocrystals in order to illustrate the conduction of holes 10 in the case of a nanocrystal structure. As illustrated in FIG. 16A, a nanocrystal structure contains well-ordered rutile structures, so that the entire film is composed of microscopic crystals. The resulting mode of hole conduction differs from an amorphous film. As described above, tungsten atoms with a valence of five exist along the surface of nanocrystals 9, and this surface region becomes a hole conduction region. It is considered that in a nanocrystal structure, holes 10 can be conducted at a low voltage due to the continuity of surface regions that act as hole conducting regions.

As described above, for a metal oxide film to have good hole conduction properties, it is considered necessary (1) for portions acting as hole conduction regions to exist, and (2) to increase the number of crystal interfaces in order for electron orbitals contributing to hole conduction to overlap. In other words, a metal oxide film (1) that includes metal atoms at a lower valence than the maximum possible valence of the metal atoms and that (2) has a nanocrystal structure can be considered a good structure for hole conduction.

Next, it is described how the effect of improving hole conduction properties is the dominating factor behind achieving a low driving voltage by using tungsten oxide with a nanocrystal structure that includes a low valence. The driving voltage of the hole injection layer 3 can also be reduced by reducing the hole injection barrier at the interface between the anode 2 and the hole injection layer 3, and by reducing the hole injection barrier at the interface between the hole injection layer 3 and the buffer layer 4. Here, the hole conduction energy was analyzed by UPS measurement of tungsten oxide films manufactured in the same way as the hole injection layer 3 in BPD-D and BPD-E, shown in Table 3, which have different hole injection characteristics. As shown in FIG. 4, at a current density of 10 mA/cm$^2$, a difference of approximately 2 V in the driving voltage was confirmed between BPD-D and BPD-E, yet no difference in the hole conduction energy was observed by UPS. In other words, the difference in hole injection voltage between BPD-D and BPD-E was not caused by the hole injection barrier at the interface between the anode 2 and the hole injection layer 3, nor by the hole injection barrier at the interface between the hole injection layer 3 and the buffer layer 4. Rather, the difference was confirmed to derive from the film structure of the hole injection layer, as described above.

Modifications (1) In the above embodiment, a tungsten oxide film formed by DC sputtering is described as an example of the hole injection layer, but neither the method of film formation nor the type of metal oxide is limited in this way. Other methods, such as the vapor deposition method or CVD, may be used. Furthermore, in the above embodiment, tungsten oxide was described as an example of the hole injection layer, but instead of tungsten oxide, a metal oxide such as molybdenum oxide (MoOx) or molybdenum-tungsten oxide (MoxWyOz), a metal nitride, or a metal oxynitride may be used.

(2) An organic EL element according to an aspect of the present invention is not limited to being used as a single element. A plurality of organic EL elements may be layered on a substrate as pixels in order to form an organic EL light-emitting device. Such an organic EL light-emitting device can be achieved by appropriately setting the thickness of each layer in each element and may, for example, be used as an illumination device or the like.

(3) A plurality of organic EL elements 1 corresponding to red, green, and blue pixels may be arranged to form an organic EL panel. When the light-emitting layer of each pixel is formed by an application process such as an inkjet process, it is desirable to form banks on the hole injection layer to separate the pixels. Forming banks prevents inks composed of light-emitting layer material of different colors from mixing together during the application process. For example, the banks are formed by applying bank material composed of photosensitive resist material onto the surface of the hole injection layer, pre-baking the bank material, exposing the bank material to light with a pattern mask, washing off unhardened, excess bank material with a developer, and finally rinsing with pure water. An aspect of the present invention may also be adopted in a hole injection layer, composed of a metal oxide, after forming the banks in the above way. The organic EL panel may also be used in an organic EL display apparatus. Such an organic EL display apparatus can, for example, be used in a variety of organic EL displays.

(4) In the above embodiment, the point at which the peak P1 clearly begins in FIGS. 15A and 15B is the point, in the direction of the center point from the peak top of the peak P1, at which the derivative first becomes zero in (a2) and (b2) in FIGS. 15A and 15B. The method of determining the point at which the peak P1 begins, however, is not limited in this way. For example, in the graph (a1) of FIG. 15A, the average value of the normalized luminance around the position at which the peak P1 begins may be taken as a baseline, and the intersection of this baseline with the peak P1 may be considered the position at which P1 begins to rise.

(5) An organic EL element according to an aspect of the present invention may be either a bottom emission type element or a top emission type element.

INDUSTRIAL APPLICABILITY

An organic EL element according to an aspect of the present invention may be favorably used in the home, in public facilities, and in the workplace in an organic EL apparatus used in various display apparatuses, televisions, displays for portable electronic devices, and the like.

REFERENCE SIGNS LIST 1 organic EL element
1A hole-only device
2 anode
3 hole injection layer
4 buffer layer (functional layer)
5 light-emitting layer (functional layer)
6 cathode
6a barium layer
6b aluminum layer
6A cathode (metal layer)
7 substrate
8 direct current power supply
9 nanocrystal
10 hole
11 segregated crystal
12 amorphous portion

The invention claimed is:

1. An organic EL element, comprising:
an anode;
a cathode;
a functional layer, containing an organic material, between the anode and the cathode; and
a hole injection layer, for injecting holes to the functional layer, between the anode and the functional layer, wherein
the hole injection layer is a metal oxide film composed of only a metal oxide,
metal atoms constituting the metal oxide include both metal atoms at a maximum valence thereof and metal atoms at a valence less than the maximum valence,
the metal oxide film includes crystals of the metal oxide, a particle diameter of the crystals being on an order of nanometers,
grain boundaries of the crystals of the metal oxide are continuously connected between two surfaces of the metal oxide film in at least one location in a thickness direction of the metal oxide film, and
the metal oxide is tungsten oxide, so that the metal oxide film is a tungsten oxide film.

2. The organic EL element of claim 1, wherein the metal atoms at the maximum valence are tungsten atoms with a valence of six.

3. The organic EL element of claim 2, wherein the metal atoms at the valence less than the maximum valence are tungsten atoms with a valence of five.

4. The organic EL element of claim 3, wherein a ratio $W^{5+}/W^{6+}$ of a number of the tungsten atoms with the valence of five to a number of the tungsten atoms with the valence of six is at least 3.2%.

5. The organic EL element of claim 4, wherein the ratio $W^{5+}/W^{6+}$ is at least 3.2% and at most 7.4%.

6. The organic EL element of claim 2, wherein a hard X-ray photoelectron spectroscopy spectrum of a surface of the tungsten oxide film exhibits a first peak and a second peak, the first peak corresponding to a $4f_{7/2}$ energy level of the tungsten atoms with the valence of six, and the second peak being in a region lower than the first peak in terms of binding energy.

7. The organic EL element of claim 6, wherein the region is between 0.3 electron volts and 1.8 electron volts lower, in terms of binding energy, than the first peak.

8. The organic EL element of claim 6, wherein an area intensity of the second peak is between 3.2% and 7.4% of an area intensity of the first peak.

9. The organic EL element of claim 2, wherein tungsten atoms at a valence less than the maximum valence cause a band structure of the hole injection layer to have an occupied energy level in a range between 1.8 electron volts and 3.6 electron volts lower than a lowest energy level of a valence band in terms of binding energy.

10. The organic EL element of claim 2, wherein the tungsten oxide film includes a plurality of crystals of the tungsten oxide, each of the crystals having a particle diameter of between 3 nm and 10 nm.

11. The organic EL element of claim 2, wherein regular linear structures at intervals of between 1.85 angstroms and 5.55 angstroms appear in a lattice image by transmission electron microscopy observation of the tungsten oxide film.

12. The organic EL element of claim 11, wherein in a 2D Fourier transform image of the lattice image, a pattern of concentric circles centering on a center point of the 2D Fourier transform image appears.

13. The organic EL element of claim 12, wherein in a plot of distance from the center point versus normalized luminance, the normalized luminance being a normalized value of luminance of the 2D Fourier transform image at a corresponding distance, at least one peak of the normalized luminance appears.

14. The organic EL element of claim 13, wherein with a peak width being a difference between a distance corresponding to a position of a peak of the normalized luminance appearing closest to the center point in the plot and a distance corresponding to a position at which the peak of the normalized luminance begins to rise, the peak width is less than 22 when a difference between a distance corresponding to the center point and a distance corresponding to the peak of the normalized luminance appearing closest to the center point is 100.

15. The organic EL element of claim 1, wherein the functional layer includes amine-containing material.

16. The organic EL element of claim 1, wherein the functional layer is one of a light-emitting layer that emits light by recombination of electrons and holes injected thereto, and a buffer layer that one of adjusts optical characteristics and blocks electrons.

17. An organic EL panel comprising the organic EL element of claim 1.

18. An organic EL light-emitting apparatus comprising the organic EL element of claim 1.

19. An organic EL display apparatus comprising the organic EL element of claim 1.

20. The organic EL element of claim 1, wherein one of the two surfaces of the metal oxide film is in contact with the anode, and another of the two surfaces of the metal oxide film is in contact with the functional layer.

21. The organic EL element of claim 2, wherein tungsten atoms with a valence of five are disposed along a surface of the crystals of the metal oxide, and the tungsten atoms with the valence of six are found inside the crystals of the metal oxide.

22. The organic EL element of claim 21, wherein the inside of the crystals of the metal oxide has a distorted rutile structure in which oxygen atoms are in octahedral coordination with a tungsten atom.

\* \* \* \* \*